US009682856B2

(12) United States Patent
Whitesides et al.

(10) Patent No.: US 9,682,856 B2
(45) Date of Patent: Jun. 20, 2017

(54) MEMS FORCE SENSORS FABRICATED USING PAPER SUBSTRATES

(75) Inventors: George Whitesides, Newton, MA (US); Xinyu Liu, Montreal (CA); XiuJun Li, El Paso, TX (US); Martin M. Thuo, Southborough, MA (US); Michael O'Brien, Whitefish, MT (US); Yu Sun, Toronto (CA)

(73) Assignee: President and Fellows of Harvard College, Cambridge, MA (US)

( * ) Notice: Subject to any disclaimer, the term of this patent is extended or adjusted under 35 U.S.C. 154(b) by 924 days.

(21) Appl. No.: 13/557,861

(22) Filed: Jul. 25, 2012

(65) Prior Publication Data

US 2014/0224018 A1 Aug. 14, 2014

Related U.S. Application Data

(60) Provisional application No. 61/513,977, filed on Aug. 1, 2011.

(51) Int. Cl.
*G01P 15/12* (2006.01)
*B81B 7/02* (2006.01)
(Continued)

(52) U.S. Cl.
CPC .............. *B81B 7/02* (2013.01); *B81C 1/0015* (2013.01); *G01G 3/13* (2013.01); *G01L 1/18* (2013.01);
(Continued)

(58) Field of Classification Search
CPC .... G01P 15/0802; G01P 15/123; G01P 15/18; G01P 2015/0862; G01L 1/18; B81C 1/0015; B81B 7/02; G01G 3/13
(Continued)

(56) References Cited

U.S. PATENT DOCUMENTS 5,132,583 A 7/1992 Chang
8,239,162 B2* 8/2012 Tanenhaus .................. 702/151
(Continued)

FOREIGN PATENT DOCUMENTS

DE 10156652 5/2003
WO 2006055731 5/2006

OTHER PUBLICATIONS

Baltes, et al., "CMOS MEMS-Present and future" , Proc the Fifteenth IEEE Conf. Micro Electro Mechanical Systems, 459-66, Las Vagas, Jan. 20-24, 2002.
(Continued)

*Primary Examiner* — Paul West
*Assistant Examiner* — Xin Zhong
(74) *Attorney, Agent, or Firm* — Wilmer Cutler Pickering Hale and Dorr LLP

(57) ABSTRACT

MEMS devices fabricated using inexpensive substrate materials such as paper or fabric, are provided. Using paper as a substrate, low cost, simple to prepare, lightweight, disposable piezoresistive sensors, including accelerometers are prepared. Signal-processing circuitry can also be patterned on the substrate material.

The sensors can be utilized as two-dimensional sensors, or the paper substrate material can be folded to arrange the sensors in a three dimensional conformation. For example, three sensors can be patterned on a paper substrate and folded into a cube such that the three sensors are orthogonally positioned on the faces of a cube, permitting simultaneous measurement of accelerations along three orthogonal directions (x-y-z). These paper-based sensors can be mass produced by incorporating highly developed technologies for automatic paper cutting, folding, and screen-printing. Also provided are methods of modifying paper for use as a substrate material in MEMS devices.

20 Claims, 20 Drawing Sheets

(51) Int. Cl.
  *G01P 15/08* (2006.01)
  *G01P 15/18* (2013.01)
  *G01L 1/18* (2006.01)
  *B81C 1/00* (2006.01)
  *G01G 3/13* (2006.01)

(52) U.S. Cl.
  CPC ........ *G01P 15/0802* (2013.01); *G01P 15/123* (2013.01); *G01P 15/18* (2013.01); *G01P 2015/0862* (2013.01)

(58) Field of Classification Search
  USPC ..................................................... 73/514.33
  See application file for complete search history.

(56) References Cited

U.S. PATENT DOCUMENTS

2004/0082247 A1    4/2004  Desai
2004/0183648 A1    9/2004  Weber
2004/0200281 A1*  10/2004  Kenny et al. .............. 73/514.33
2009/0326851 A1*  12/2009  Tanenhaus ............. G01C 21/16
                                              702/96
2011/0111517 A1*   5/2011  Siegel et al. .................. 436/164

OTHER PUBLICATIONS

Kim, et al., "Nanonewton force-controlled manipulation of biological cells using a monolithic MEMS microgripper with two-axis force feedback", Micromech. Microeng., 18:055013 (2008).

Liu, at al., "Paper-based piezoresistive MEMS sensors", Royal Soc Chem., 11:2189-96 (2011).

Motoyoshi, "Through-Silicon via (TSV)", Proceedings of the IEEE, 97:43-48 (2009).

Siegel, at al. Foldable Printed Circuit Boards on Paper Substrates. Adv. Funct. Mater. 20:28-35 (2010).

* cited by examiner

FOLD

MEMS FORCE SENSORS FABRICATED USING PAPER SUBSTRATES

CROSS-REFERENCE TO RELATED APPLICATIONS

This application claims priority under 35 U.S.C. §119 to U.S. Provisional Application Ser. No. 61/513,977 filed Aug. 1, 2011.

STATEMENT REGARDING FEDERALLY SPONSORED RESEARCH OR DEVELOPMENT

This invention was made with Government Support under N66001-10-1-4003 awarded by the U.S. Department of the Navy. The Government has certain rights in the invention.

FIELD OF THE INVENTION

The present invention relates to two and three dimensional paper sensors which are high economical and easy to manufacture and use.

BACKGROUND OF THE INVENTION

Improved methods of microfabrication have permitted the construction of micro-electro-mechanical systems (MEMS) for use in a wide array of important applications. Commercial applications include digital micromirror devices (DMD; Texas Instruments), accelerometers used in consumer electronics and automobiles (e.g., to detect collisions and trigger airbag deployment; Analog Devices and Motorola), gyroscopes used to detect yaw in automobiles (e.g., to trigger dynamic stability control), and pressure/flow sensors for industrial uses (Honeywell).

MEMS devices are typically fabricated from silicon-based materials, such as single crystal silicon, polycrystalline silicon, silicon dioxide, and silicon nitride, using modified semiconductor device fabrication technologies, normally used to make integrated circuits. These technologies include molding and plating, wet etching, dry etching, such as reactive-ion etching (RIE) and deep reactive-ion etching (DRIE), and electro-discharge machining (EDM). While these fabrication strategies can produce silicon-based MEMS which exhibit excellent device performance, they are typically time consuming, require costly materials, and must be conducted in a cleanroom environment. As a result, MEMS devices are relatively costly, limiting their potential use in many applications.

Therefore, it is an object of the invention to provide MEMS devices, such as MEMS sensors, which are inexpensive, simple to fabricate, lightweight, and/or disposable.

It is also an object of the invention to provide methods of manufacturing MEMS devices, such as MEMS sensors, using inexpensive, lightweight, and/or disposable substrates such as paper.

It is a further object of the invention to provide methods of tuning the chemical and physical properties of substrates, including paper and fabric, for use in MEMS devices.

SUMMARY OF THE INVENTION

The present invention relates to two and three dimensional paper sensors which are high economical and easy to manufacture and use. These can be made from two-dimensional ("2D") or three-dimensional ("3D") substrates. In a preferred embodiment the substrate is made of paper, but could be of another inexpensive material such as fabric or a plastic film overlaid on a paper substrate, where the paper properties (chemical such as hydrophobicity, physical such as thickness, and form such as pleated) can be used to impart structure and function to the sensor.

The sensors are made by printing or screening of circuitry onto the substrate using piezoresistive and/or conductive inks or comparable materials, which can then be attached to wires or other means of transmitting a signal. These may be assembled prior to or at the time of application. In one embodiment the sensors are printed on a roll which is then applied in a manner similar to labels, with pre-applied or simultaneously applied adhesive. In another embodiment, the sensors are applied at the time of manufacture, for example, when air bags in a car are assembled, toys built, or shipping containers assembled.

BRIEF DESCRIPTION OF THE DRAWINGS

FIG. 1A shows a schematic view of a paper-based force sensor using a carbon resistor as the sensing component. FIG. 1B shows the fabrication process of the paper-based sensor involving laser cutting of paper and screen printing of carbon and silver inks. FIG. 1C shows an array of four paper-based piezoresistive devices with labeled dimensions.

FIG. 2A shows the calibration plots of force-detection data based on the measurements of seven devices. The schematic insets illustrate the types of mechanical strains (stretching vs. compressive) applied to the carbon resistors. The solid line represents a linear fit to the force-detection data with a regression equation: $y=2.0\times$ ($R^2=0.9999$, $N=7$). FIG. 2B shows the data of beam stiffness as a function of the number of repeated bends.

FIG. 3A shows linear current-voltage curves for carbon resistors ($N=7$), showing the ohmic I-V characteristics of a good conductor. The slope of the current-voltage curve represents the resistance of the carbon resistor. FIG. 3B shows the calibration plot of the relative change in resistance as a function of the change in temperature.

FIG. 4A shows the calibration plot of the output of the sensor (resistance change) as a function of the input to the sensor (applied force). The solid line represents a linear t to the experimental data with a regression equation: $y=0.27\times$ ($R^2=0.998$, $N=7$). The slope of the solid line represents the sensitivity of the sensors.

FIG. 4B shows the calibration plots of the relative change in resistance as a function of the applied strain. The solid line represents a linear fit to the data with a regression equation: $y=4.1\times$($R^2=0.998$, $N=7$). The slope of the solid line represents the gauge factor of the sensor, which is defined as the ratio of relative change in resistance ($\Delta R/R_0$) to the applied mechanical strain (c).

FIG. 5A shows a schematic diagram of a paper cantilever beam with perforation of the fold lines made by a laser cutter. FIG. 5B shows (a folded sensor with a wedge-shaped structure. FIG. 5C shows the force-detection curves of the folded and un-folded beams. The solid lines represent linear fits to the data with regression equations: $y=2.0\times$($R^2=0.9998$, $N=7$) for un-folded devices, and $y=2.8\times$ ($R^2$=0.991, N=7) for folded devices. The stiffness (2.8 mN $mm^{-1}$) of the folded beams is 40% higher than that of the un-folded beams (2.0 mN $mm^{-1}$). FIG. 5D shows calibration plots of output of the sensor (change in resistance) as a function of input of the sensor (force applied to the free end of the beam). The solid lines represent linear fits to the data with regression equations: y=0.36×($R^2$=0.996, N=7) for un-folded devices, and y=2.9×($R^2$=0.998, N=7) for folded devices. Because the folding of the beam concentrates mechanical strain on the carbon resistor, the sensor with a folded beam showed higher sensitivity (0.36 $\Omega mN^{-1}$) than the sensor with an un-folded beam (0.29 $\Omega mN^{-1}$).

FIG. 6A shows a schematic diagram of a Wheatstone bridge circuit, where $R_s$ is the resistor with unknown resistance to be measured and $R_1$, $R_2$, and $R_3$ are resistors with known resistance. FIG. 6B shows a Wheatstone bridge circuit laid out on the base of a paper-based force sensor. Electrical connections were screen-printed using silver ink to connect the four resistors. FIG. 6C shows a calibration plot of the output of the circuit as a function of the input to the sensor (force applied to the free end of the sensor beam). The solid line represents a linear fit to the experimental data with a regression equation: y=0.84×($R^2$=0.996, N=7).

FIG. 7A shows a schematic diagram of the setup for measuring the Young's modulus of PDMS cantilever beams. A paper-based force sensor is controlled to contact and detect a PDMS cantilever beam, during which the contact force and detection of the PDMS beam are measured. The Young's modulus of the PDMS is calculated using a beam equation. The dimensions of the PDMS beams are summarized in Table 2. FIG. 7B shows a plot of values of Young's modulus for PDMS with different mixing ratios (w/w: 5:1, 10:1, and 20:1) of the polymer base to the cross-linking agent. The values of Young's modulus in the plot are means of data from seven beams.

FIG. 8A shows a schematic side view of a paper-based balance where force-sensing beams with carbon resistors are used for tethering a weighing plate, and measuring the force due to gravity of a weight. FIG. 8B shows the paper-based balance where four force sensing beams are involved. FIG. 8C shows a calibration plot of the resistance change from one sensing beam as a function of applied calibration weight. The solid line represents a linear fit to the experimental data with a regression equation: y=0.26x ($R^2$=0.993, N=7).

FIG. 11A shows a calibration plot of the output (resistance change) of the sensor as a function of the input (applied force), based on measurement of seven devices. The solid line represents a second-order polynomial fit to the experimental data with a regression equation: y=0.028$x^2$+0.14x ($R^2$=0.999, N=7). FIG. 11B shows a calibration plot of the relative change in resistance as a function of the applied strain. The solid line represents a second-order polynomial fit to the experimental data with a regression equation: y=3300$x^2$+2.3x ($R^2$=0.999, N=7).

FIG. 12A shows data collected from an un-silanized device, and FIG. 12B shows data collected from a silanized device. The data demonstrate the repeatability of the performance of the sensor. Silanization of the paper surface minimizes the effect of environmental humidity on the performance of the sensor, and the silanized devices produced less variation in output of the sensor than the un-silanized devices. The solid lines represent a linear fit to the experimental data with regression equations: (A) y=0.29×($R^2$=0.993, N=7), and (B) y=0.33×($R^2$=0.997, N=7).

FIG. 13A shows a schematic view of a paper-based accelerometer built on a paper cube. Two carbon resistors are patterned on a paper beam, which can detect an inertial force applied to the central proof mass due to acceleration. Readout circuits (Wheatstone bridge in this work) are also patterned on both sides of the paper structure to form a monolithic paper chip. FIG. 13B shows a schematic view of the Wheatstone bridge circuit. $R_1$ and $R_2$ are the carbon resistors on the top and bottom surface of the paper sensing beam.

FIG. 14A shows a schematic diagram of the fabrication process, involving laser-cutting, screen-printing, bonding, and folding of paper. FIG. 14B shows an unfolded paper structure (left) with screen-printed piezoresistors/circuits and bonded thick paper frame (blue), and a complete accelerometer after folding (right). Dashed folding lines are cut to facilitate the folding process, and pairs of insets and slots are used to connect different surfaces to form a mechanically stable cube. Numbers 1-6 illustrate the corresponding surfaces before and after folding.

FIG. 15A shows the detection of a contact force applied to the central proof mass with a finger. FIG. 15B shows the detection of drop-impact acceleration by dropping the paper cube to the ground from 0.2 m above. The amplitude value of the initial negative peak (32 mV) corresponds to the gravitational acceleration (1 g).

FIG. 16A shows water droplets (50 μL) on a hydrophobic paper surface. FIG. 16B shows data of water contact angles for different types of silanized paper.

FIG. 17A shows data of water contact angles for air-plasma-treated and un-treated paper substrates. FIGS. 17B and 17C show high-magnification (4000×) SEM images of (17B) un-treated and (17C) air-plasma-treated paper fibers. No difference in surface roughness of the paper fibers was observed.

FIG. 18A shows a schematic diagram of cross-section view of the microfluidic device. FIGS. 18B and 18C are photographs of devices constructed using (18B) a hydrophobic paper substrate and (18C) a hydrophilic plastic substrate.

DETAILED DESCRIPTION OF THE INVENTION

I. Definitions

Figure 1A:
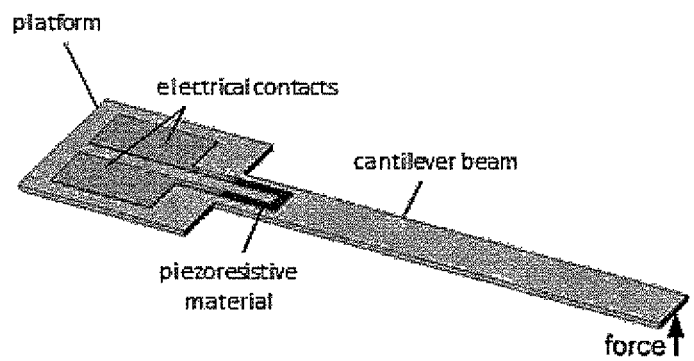
FIG. 1A-C shows the design and fabrication of paper-based piezoresistive force sensor.

"Piezoresistive material", as used herein, refers to a conductive material which changes resistance to the flow of electrical current when subjected to a mechanical stress.

"Piezoresistive element", as used herein, refers to a patterned structure fabricated from a piezoresistive material which is capable of registering a change in resistance to the flow of an electrical current when subjected to a mechanical stress.

"Substrate material", as used herein, refers to a flexible, insulating material on which one or more piezoresistive materials is patterned to form a MEMS device.

"Insulating material", as used herein, refers to any material which resists the flow of electric charge.

"Paper", as used herein, refers to a web of pulp fibers that are formed, for example, from an aqueous suspension on a wire or screen, and are held together at least in part by hydrogen bonding. Papers can be manufactured by hand or by machine. Paper can be formed from a wide range of matted or felted webs of vegetable fiber, such as "tree paper" manufactured from wood pulp derived from trees, as well as "plant papers" or "vegetable papers" which include a wide variety of plant fibers (also known as "secondary fibers"), such as straw, flax, and rice fibers. Paper can be formed from substantially all virgin pulp fibers, substantially all recycled pulp fibers, or both virgin and recycled pulp fibers.

"Fabric", as used herein, refers to a textile structure composed of mechanically interlocked fibers or filaments. The fibers may be randomly integrated (non-woven), closely oriented by warp and filler strands at right angles to one another (woven), or knitted. The term fabric encompasses both natural fabrics (i.e., fabrics formed from naturally occurring fibers) and synthetic fabrics (i.e., fabrics formed at least partially from one or more synthetic fibers), including, but not limited to cotton, rayon, wool, silk, and polyesters, as well as biodegradable fabrics containing polyhydroxyalkanoates (PHAs).

"Aspect ratio", as used herein, refers to the ratio of a structural component's length to its width.

"Cantilever beam", as used herein, refers to a structural component of a device which protrudes from or is anchored to a stationary platform exclusively at one end. As a result, when a force is applied to the surface of a cantilever beam, one end of the beam is held stationary (i.e., the end of the beam anchored to the stationary platform), while the other end of the cantilever beam is deflected (i.e., the end of the beam not anchored to the stationary platform). The cantilever beam typically has an aspect ratio of greater than 3:1, more preferably greater than 4.5:1, most preferably greater than 6:1.

"Electrical device components", as used herein, collectively refers to piezoresistive materials, conducting materials, insulating materials, resistors, capacitors, and any additional elements which can be patterned on the substrate material to form a force-sensing device, point of contact for an electrical lead or circuit, or integrated signal-processing circuit.

"Deflectable region", as used herein, refers to a portion of the substrate material which is designed to be deflected by an external stimulus.

"Stationary platform", as used herein, refers to a portion of the substrate which is designed not to be deflected by the external stimulus.

"Proof mass", as used herein, refers to a mass incorporated into the deflectable region, which serves to deform the deflectable region when the force sensor is subjected to an applied acceleration.

"Micro-electro-mechanical system" (MEMS), as used herein, refers to a small mechanical device such as a sensor, actuator, or other structure, which is driven by electricity. MEMS, as used herein, refers to such devices which possess a height, length, and width of less than 1 cm, more preferably less than 50 mm, most preferably less than 30 mm.

II. MEMS Devices

MEMS devices are fabricated by patterning one or more piezoresistive materials and/or one or more piezoelectric materials on a flexible, insulating substrate. Exemplary devices include force sensors based on piezoresistive active materials which exhibit a change in resistance upon application of a mechanical stress. Alternatively, similar devices can be fabricated employing piezoelectric active materials.

The devices are constructed by patterning one or more piezoresistive materials on one or more sides of a flexible, insulating substrate material. When a mechanical stress is applied to the flexible substrate material, the piezoresistive material patterned on its surface(s) experiences a proportional mechanical stress. The mechanical stress induces a change in resistance of the piezoresistive material. Measuring the change in resistance of the piezoresistive materials provides a means to quantify the force applied to the substrate material.

Many MEMS sensors (including commercial devices) take advantage of the piezoresistive effect; however, such sensors are typically constructed from silicon-based semiconductor materials. MEMS devices fabricated using inexpensive substrates, such as paper, are provided herein.

A. Piezoresistive Force Sensors

Piezoresistive force sensors can be constructed from a piezoresistive material pattered on a flexible substrate material to form a piezoresistive element.

In preferred embodiments, the substrate material is paper, more preferably paper which has been covalently or non-covalently modified to increase its hydrophobicity. Other potential substrate materials include fabrics, woven or non-woven textiles, laminated films, etc. In certain embodiments, the substrate material is covalently functionalized to increase the hydrophobicity of the surface. In particularly preferred embodiment, the substrate material is chromatography paper which has been covalently functionalized to increase hydrophobicity.

The flexible substrate material can be assembled from multiple components; however, it is preferably a monolithic piece of substrate material. The substrate material can be fabricated to form a device of any desired shape. Preferably, the substrate material will be fabricated into a shape which contains one or more stationary platforms and one or more deflectable regions. Stationary platforms are device components formed of substrate material which are designed not to be deflected by the external stimulus to be measured. Deflectable regions are device components formed or substrate material which are designed to be deflected by the external stimulus to be measured. Alternatively, the entirety of the substrate material can be designed to be deflectable. In such cases, the substrate material is affixed to a non-deflectable surface, for example, by use of an adhesive.

The force sensor contains one or more piezoresistive elements positioned to traverse a portion of the deflectable region of the substrate material. Accordingly, as the deflectable region flexes upon application of a mechanical stress, the piezoresistive element is mechanically stressed. The mechanical stress exerted on the piezoresistive element results in a change in resistance. Preferably, the piezoelectric element is positioned to traverse the portion of the surface area of the deflectable region which experience maximum surface strain upon deflection of the substrate material.

The piezoresistive element can be patterned in any shape so as to permit its incorporation into a closed electrical circuit (e.g., in one continuous line, loop, or series of connected segments, which permits the flow of electrical current).

Preferably, the piezoresistive element is patterned to facilitate connection of the piezoresistive element to additional components of an electrical circuit. For example, the piezoresistive element can be patterned so as to facilitate contact with electrical leads, wires, or circuit components. In some cases, the electrical leads and circuit components are present externally, and are electrically connected to the piezoresistive material via wire bonding (i.e., a two-chip approach).

In preferred embodiments, a signal-processing circuit, such as a Wheatstone bridge, is integrated into the piezoresistive force sensor device. Such an embodiment is exemplified in FIG. 6. In these devices, the signal processing circuit is preferably patterned on the stationary platform; however, one or more components of a signal-processing circuit.

In certain embodiments, the force sensor is an accelerometer which quantifies acceleration. In some cases, a proof mass may be incorporated into the deflectable region of the substrate material. Under an applied acceleration, the proof mass deforms the supporting deflectable region, stressing the piezoresistive element. In some cases, a portion of the deflectable region itself functions as a proof mass. In other cases, a proof mass is affixed to the deflectable region, for example by an adhesive. The proof mass can be fabricated from the substrate material, or can be formed from another material, such as a metal or plastic.

1. Force-Sensing Cantilever Beam Devices

In one embodiment, the piezoresistive force sensor is a force-sensing cantilever beam device. An exemplary force-sensing cantilever beam device is represented schematically in FIG. 1.

Force-sensing cantilever beam devices contain a cantilever beam (i.e., the deflectable region) extending from one edge of a stationary platform.

A suitable piezoresistive element is patterned on top and/or bottom surfaces of the cantilever beam. Preferably, the piezoresistive element(s) traverse the region where the cantilever beam meets the stationary platform. The piezoresistive elements are preferably incorporated that this juncture, as maximum surface strain of the cantilever beam occurs at this point when a force is applied to the end of the cantilever beam. The piezoresistive element can be patterned in any suitable shape, including a "U"-shape, as shown in FIG. 1.

Cantilever beams typically have a high aspect ratio, so as to increase surface strain at the juncture of the cantilever beam and the stationary platform. Preferably, the cantilever beam has an aspect ratio of greater than 3:1, more preferably greater than 4.5:1, most preferably greater than 6:1.

In some embodiments, a signal-processing circuit, such as a Wheatstone bridge, is integrated into the force-sensing cantilever beam device. An exemplary force-sensing cantilever beam device containing an integrated signal-processing circuit is shown in FIG. 6.

2. Force-Sensing Cantilever Beam Array Devices

In another embodiment, more than one cantilever beam extends from a single stationary platform. Such devices are referred to herein as force-sensing cantilever beam array devices. An exemplary force-sensing cantilever beam array device is illustrated in FIG. 1C.

In certain embodiments, the force-sensing cantilever beam array device contains more than one cantilever beam extending from the same edge of a single stationary platform. In other cases, one or more cantilever beams can extend from the multiple edges of a single stationary platform. In some embodiments, the deflectable ends of one or more of the cantilever beams can be connected, increasing to increase the surface area and/or mass of the deflectable regions.

3. Force-Sensing Cantilever Beam Balances

In another embodiment, one or more stationary platforms and multiple cantilever beams are integrated to form a force-sensing cantilever beam balance. The force-sensing cantilever beam balance is capable of functioning, for example, as a balance or an accelerometer. An exemplary force-sensing cantilever beam balance is shown in FIG. 8.

Force-sensing cantilever beam balances are formed from multiple cantilever beams whose deflectable ends are joined by a weighing plate. The weighing plate serves to link the cantilever beams and to distribute the deflection (caused by a mass placed on the weighing plate or by a stimulus) across the conjoined cantilever beams.

In some cases, the force sensing cantilever beam balance is used as an accelerometer. Depending on the application, the weighing plate serves can serve as the proof mass for the accelerometer. In other cases, a proof mass is attached to the weighing plate.

4. Three-Dimensional Force Sensors

In some embodiments, multiple two-dimensional force-sensing devices, such as those described above, are arranged to form a three dimensional structure. An exemplary three-dimensional force sensor is shown in FIGS. 13 and 14.

In some cases, multiple two-dimensional force sensors are arranged in a 3-dimensional, orthogonal configuration to measure force simultaneously along three axes (x-y-z). For example, multiple two-dimensional force sensors can be connected as faces of a closed cubical structure. The cubical structure can, for example, incorporate three force sensors within three different faces of the cube, such that one force sensor is located to measure force along each axis. In addition, the cubic architecture advantageously provides increased structure and strength to the paper-MEMS device as compared to 2-dimensional paper-MEMS device.

In some cases, multiple sensors and electrical elements are first fabricated on a 2D paper substrate, and then folded into a 3D, orthogonal configuration. Preferably, three one-axis force sensors and their readout circuits are first fabricated on a single piece of paper substrate material. Subsequently, the paper substrate is folded to form a cube. The three sensing elements can be configured on the paper substrate in such a fashion that they locate on three orthogonal surfaces of the paper cube after folding. This 3-dimensional arrangement of sensors provides the opportunity to simultaneously measure force on three axes.

In a preferred embodiment, the three force-sensing devices are accelerometers. Such an arrangement permits measurement of acceleration along three orthogonal directions (x-y-z).

B. Substrate Materials

A variety of materials may serve as a substrate material for the fabrication of the devices described above. Suitable substrate materials include materials which are flexible and electrically insulating. Specifically, the substrate material should be capable of being deflected while continuing to function as an insulator. For certain applications, it is preferable that the substrate material can be folded or otherwise mechanically shaped to impart structure and function to the sensor. For example, in some embodiments, an array of two-dimensional force sensors are folded to construct a three dimensional array of force sensors.

Non-limiting examples of substrate materials include cellulose, derivatives of cellulose such as nitrocellulose or cellulose acetate, paper (e.g., filter paper, chromatography paper), thin films of wood, fabrics, such as cotton, silk or wool, and paper products coated with one or more polymeric or wax coatings, such as wax paper or waterproof paper.

Preferably, the substrate material is paper. Paper is inexpensive, widely available, readily patterned, thin, lightweight, and can be disposed of with minimal environmental impact. Furthermore, a variety of grades of paper are available, permitting the selection of a paper substrate with the weight (i.e., grammage), thickness and/or rigidity and surface characteristics (i.e., chemical reactivity, hydrophobicity, and/or roughness), desired for the fabrication of a particular device. Suitable papers include, but are not limited to, chromatography papers, card stock, filter paper, vellum paper, printing papers, wrapping papers, ledger paper, bank paper, bond paper, drawing papers, fish paper, wax paper, and photography papers. These can also be formed in a manner increasing rigidity, such as by pleating, providing struts, or lamination.

In some embodiments, the substrate material is paper having a grammage, expressed in terms of grams per square meter ($g/m^2$), of greater than 75, 100, 125, 150, 175, 200, 225, or 250.

In some embodiments, the Young's modulus of the substrate material is less than the Young's modulus of single crystalline silicon. In some cases, the Young's modulus of the substrate material is 25 times less, more preferably 40 times less, most preferably 50 times less than the Young's modulus of single crystalline silica. In certain embodiments, the Young's modulus of the substrate material is less than 30 GPa, more preferably less than 15 GPa, most preferably less than 5 GPa.

1. Modification of the Hydrophobicity of Paper Substrates

Many suitable substrate materials, including many papers, are hydrophilic and will readily absorb water present in the environment. In some cases, this may result in undesirable changes in the mechanical and/or electrical properties of a device fabricated using such a substrate. To address this concern, the substrate material can be covalently or non-covalently modified to alter the hydrophobicity/hydrophilicity of the material.

a. Covalent Modification

In certain embodiments, the substrate material is covalently or non-covalently modified to increase the hydrophobicity of the surface. For example, hydroxyl groups present on the surface of a paper substrate material may be covalently functionalized to increase the hydrophobicity of the material.

In one embodiment, the surface hydroxyl groups of the paper substrate material (i.e., the cellulose fibers) are reacted with a linear or branched alkyl-, fluoroalkyl-, or perfluoroalkyl-trihalosilane, to form surface silanol linkages. In preferred embodiments, the surface of the paper is reacted with one or more fluoroalkyl-, or perfluoroalkyl-trichlorosilanes, such as (tridecafluoro-1,1,2,2-tetrahydrooctyl)trichlorosilane, to form a fluorinated, highly textured, hydrophobic surface on the paper substrate.

In another embodiment, the surface hydroxyl groups of the paper substrate material are acylated by reaction with one or more hydrophobic groups functionalized with an acid chloride. In preferred embodiments, the hydrophobic functional group is an aryl ring substituted with one or more fluorine atoms and/or trifluorormethyl groups or a linear or branched alkyl group substituted with one or more halogen atoms. The introduction of halogenated functional groups via glycosidic linkages increases the hydrophobicity of the paper surface.

b. Non-Covalent Modification

The hydrophobicity of the substrate material can also be increased through non-covalent modification of the surface. For example, the surface of the substrate material can be coated with one or more hydrophobic materials, such as waxes or hydrophobic polymers such as Teflon®. Non-covalent coatings can be applied to the paper surface using a variety of techniques known in the art, including, but not limited to, painting, dipping, spraying, spin-casting, and brushing.

c. Characterization of the Substrate Hydrophobicity

The hydrophobicity/hydrophilicity of the substrate can be quantitatively assessed by measuring the contact angle of a water droplet on the substrate surface using a goniometer. In some embodiments, the substrate has a contact angle of less than 90° (i.e., it is hydrophilic). In preferred embodiments, the substrate has a contact angle of more than 90° (i.e., it is hydrophobic). In some embodiments, the substrate has a contact angle of more than 100°, 105°, 110°, 115°, 120°, 125°, 130°, 135°, 140°, 145°, 150°, or 155°. In preferred embodiments, the substrate material has a contact angle of more than 130°.

2. Modification of Substrate Rigidity

The rigidity of the substrate material can also be modified as required for device performance. The rigidity of the paper substrate can be modified by coating the substrate with one or more polymeric materials.

In some cases, part or all of the substrate material can be affixed to a support material designed to increase the rigidity of the substrate. Examples of suitable support materials include polymer films, metal films, semiconductors, and glass. The substrate material can be attached to the support material using a variety of conventional adhesives.

3. Modification of Paper Substrates during Papermaking

In some cases, the paper substrate is modified during the papermaking process to provide the hydrophobicity, rigidity, and/or surface chemistry desired for device fabrication.

For example, the pulp fibers used to make the paper substrate are chemically modified, for example by covalent substitution of one or more of the hydroxyl groups on the cellulose backbone, prior to or during the paper making process. This method can be used to enhance the hydrophobicity of the substrate.

In one case, one or more strength agents can be incorporated during the paper manufacturing process to increase the strength and rigidity of the paper substrate. Examples include cationic, anionic, and amphoteric polymers including charged polyacrylamides.

4. Modification to Increase Adhesion

The surface of the substrate material can be treated to improve adhesion of the substrate material to electrical device components, proof masses, adhesives, support materials, and/or other surfaces. For example, the paper surface may be treated with a suitable chemical adhesion promoter or a plasma prior to application of an adhesive or electrical device component.

C. Piezoresistive Materials

The piezoresistive element in the force sensors described herein can be formed from any suitable piezoresistive material, such as those disclosed in U.S. Pat. No. 5,132,583 to Chang, et al. and U.S. Patent Application Publication No. US 2004/0183648 to Weber, et al.

Preferably the piezoresistive material is applied in the form of a piezoresistive ink which can be readily applied and patterned using conventional technologies such as ink-jet or screen printing. In some cases, the piezoresistive ink is a curable piezoresistive ink designed to be cured after application to the substrate material. Curable piezoresistive inks can be formulated to be thermally or UV curable, and are typically composed of conductive particles or conductive polymers dispersed in a resin matrix. The resin matrix can include a combination of monomers, oligomers, and polymers which polymerize upon heating or UV irradiation. The resin can also contain one or more initiators, such as a photoinitiator, to facilitate curing.

In other cases, the piezoresistive material is applied in the form of a piezoresistive ink which contains conductive particles or conductive polymers dispersed in a volatile solvent. Such inks can be applied to the substrate surface using conventional patterning techniques, such as ink-jet printing or screen printing. After application, the volatile solvent can be removed using heat, reduced pressure, or flow of an inert gas.

The piezoresistive ink may contain conductive particles including, for example, carbon black, graphite, metal microparticles, metal nanoparticles, metal oxide microparticles, and metal oxide nanoparticles. Preferably, the piezoresistive material contains conductive carbon particles, such as carbon black or graphite. Suitable inks are commercially available, and include graphite inks such as E3456 (Ercon Inc., Wareham, Mass.).

Conductive Materials

Conductive materials can be used to form a variety of circuitry components, including wires, and electrical contact pads. Non-limiting examples of electrically conductive materials include metals, conductive polymers, conductive greases, conductive adhesives, any other material that is electrically conductive, or a combination thereof. In one or more embodiments, the conductive materials include metal. Non-limiting examples of suitable metals include Sn, Zn, Au, Ag, Ni, Pt, Pd, Al, In, Cu, or a combination thereof. In other embodiments, the conductive materials include conductive polymers. Non-limiting examples of conductive polymers include polyacetylenes, polypyrroles, polyanilines, poly(thiophene)s, poly(fluorene)s, poly(3-alkylthiophene)s, polytetrathiafulvalenes, polynaphthalenes, poly(p-phenylene sulfide), poly(para-phenylene vinylene)s, or any combination or derivative thereof. In yet other embodiments, the conductive materials include conductive grease, conductive adhesives or any other material that is electrically conductive.

In a preferred embodiment, the conductive material is a conductive ink, such as a silver ink, which can be screen printed or ink-jet printed to form circuitry elements on the substrate surface.

E. Insulating Materials

In some cases, insulating materials may be incorporated between conductive features patterned on a substrate material.

In addition, it may also be desirable to cover one or more electrical device components, such as a piezoresistive element or a signal processing circuit, with an insulating material to provide protection from wear and/or environmental conditions. In some embodiments, all of the electrical device components patterned on the substrate surface are completely covered with a protective layer of one or more insulating materials. In other embodiments, one or more entire surfaces of the force-sensor is covered with a protective layer of one or more insulating materials.

Suitable insulating materials include, but are not limited to insulating adhesive tapes, such as Scotch Tape, conventional varnishes, polysterene, polyethylene, or polyvinylchloride.

F. Adhesives

Adhesives may be applied to one or more portions of a force sensor to affix, for example, circuitry components, support materials, or proof masses to the substrate material. In addition, adhesive may be applied to the force sensor to adhere the force sensor to a surface.

Suitable adhesives are known in the art, and can be selected based on the application and on the two materials being joined. The adhesive can be, for example, a hot melt adhesive, a radiation curable adhesive, or a two-part curable epoxy.

Electronic components can be attached to paper substrates using commercially available conductive epoxies. Conductive epoxies are ideal for bonding to paper substrates because they can be applied and cured at room temperature, and require no flux.

III. Methods of Fabricating MEMS Devices

Fabrication of the force sensor can involve fabrication of the substrate material, pattering of the electrical device components on the substrate material, and post-patterning processing. In some cases, it may be preferred to pattern the electrical device components on the surface of the substrate material prior to fabricating the substrate material into the desired shape. Alternatively, the substrate material may be fabricated into the desired shape prior to the patterning of electrical device components.

A. Methods of Fabricating Substrate Material Substrate materials can be fabricated into appropriate two-dimensional shapes for devices described above using a variety of methods. The substrate material can be mechanically cut, for example, by using a scissor, blade, knife, dye, or punch. Alternatively, the paper substrate can be fabricated using a laser cutter. In certain embodiments, the substrate material may also be perforated to allow the fabrication of circuitry features passing through the substrate material or to facilitate folding or separation of the sensors after fabrication.

If desired, the desired two-dimensional shape required for the device can be designed on a computer using a layout editor (e.g., Clewin, WieWeb Inc.). The two-dimensional substrate shape can be printed on to the surface of a desired substrate material using, for example, conventional ink-jet printing or laser printing. Alternatively, the computer can be integrated with a laser cutter to automatically B. Methods of Patterning Electrical Device Components Electrical device components, including piezoresistive materials, conductive materials, and insulating materials, can be patterned on one or more surfaces of a substrate using methods known in the art. Suitable methods are described, for example, in U.S. Patent Application Publication No. US 2011/0111517 to Siegel, et al. and Siegel, et al. "Foldable Printed Circuit Boards on Paper Substrates. *Adv. Funct. Mater.* 20:28-35 (2010).

For example electrical device components can be deposited onto a substrate surface using stencils. Stencils contain a pattern of holes or apertures having a shape equivalent to one or more features being patterned onto the substrate surface. Piezoresistive, conductive, and insulating materials can be deposited through the holes or apertures in the stencil onto the substrate surface.

Stencils could be made from a variety of materials such as including metal, plastics, or patterned layers of dry-film resist. Non-limiting examples of metals for manufacturing stencils include stainless steel and aluminum. Non-limiting examples of plastic for manufacturing stencils include polyester films such as mylar and vinyl, such as Grafix® Frisket film. Alternatively, patterned layers of dry-film resist can be used as stencils.

In one or more embodiment, metals or plastics are used to manufacture stencils and patterns of metallic pathways can be designed on a computer using a layout editor, (e.g., Clewin, WieWeb Inc.) and stencils based on the design can be obtained from any supplier (e.g., Stencils Unlimited LLC (Lake Oswego, Oreg.)). In certain embodiments, the stencil can be removed from the paper after deposition. In certain other embodiments, one side of the stencil is sprayed with a layer of spray-adhesive (e.g., 3M Photomount, 3M Inc.) to temporarily affix the stencil to the paper substrate. After deposition, the stencil can be peeled away from the paper. The stencils can be reused multiple times, e.g., more than 10 times. In other embodiments, patterned layers of dry-film resist can be used as stencils. Dry film resist can be patterned when exposed to UV light through a transparency mask and developed in dilute sodium hydroxide solution. The patterned dry-film resist can be attached to a coating sheet of plastic or directly affixed to the substrates by pressing the resist-side to the surface of the substrates and passing multi-sheet structure through heated rollers in a portable laminator (Micro-Mark, Inc). The coating sheet of plastic can then be peeled away, resulting in a sheet of paper with dry film resist patterned on one side.

A variety of techniques could be used to deposit electrical device components onto the substrates of the force sensor devices through stencils. Non-limiting examples of such techniques include evaporating through stencils, sputter-depositing through stencils, spray depositing through stencils, squeegeeing or screen printing through stencils, or evaporating or sputter-depositing a thin layer of conductive material through stencils Electrical device components can be evaporated onto the substrates of the force sensor devices through stencils. Evaporation is a method of thin film deposition in which the source material is evaporated in a vacuum. The vacuum allows vapor particles to travel directly to the target object (substrate), where they condense back into a solid state. Detailed descriptions of evaporation deposition can be found in S. A. Campbell, *Science and Engineering of Microelectronic Fabrication*, Oxford University Press, New York (1996). Evaporating requires a high vacuum, is applicable to a variety of metals, and can deposit metal at rates of up to 50 nm/s. In certain embodiments, electrical device components such as metals are evaporated onto the substrates through stencils made of metal, plastic, or photoresist. In certain other embodiments, electrical device components are evaporated onto the substrates through stencils made of metal or plastic based on a silk-screen soaked in photoresist. In some cases, a thin layer of an electrical device component is evaporated onto the substrate material, and then a thicker layer of an electrical device component is deposited by electrodeposition or electroless deposition. The metal can be evaporated on a paper substrate material using, for example, an e-beam evaporator. Metals, such as 100% Sn, 100% In, 100% Au, 100% Ag, 52% In-48% Sn Eutectic, 100% Ni and 100% Zn can be patterned onto the substrate surface to create circuitry components using these methods.

Electrical device components can be sputter-deposited onto the substrates of the force sensor devices through stencils. Sputter deposition is a physical vapor deposition method of depositing thin films by sputtering, i.e., ejecting, the electrical device component from a source onto the substrate material. Detailed descriptions of sputtering deposition can be found in S. A. Campbell, *Science and Engineering of Microelectronic Fabrication*, Oxford University Press, New York (1996). Sputter-deposition is usually performed at a lower vacuum (>75,000 uTorr) and deposits electrical device components such as metals at a lower rate than evaporation (e.g., 1 nm/s for Au, with lower rates and higher energy requirements for other metals). In certain embodiments, electrical device components such as metals are sputter-deposited onto the substrates through stencils made of metal, plastic, or photoresist. In certain other embodiments, electrical device components are sputter-deposited onto the substrates through stencils made of metal or plastic based on a silk-screen soaked in photoresist. In other cases, a thin layer of an electrical device component is sputter-deposited onto the substrates and then a thicker layer of an electrical device component is deposited by electrodeposition or electroless deposition. The electrical device component can be deposited onto a paper substrate, for example, by sputtering using a Cressington 208HR benchtop sputter coater. Metals, such as 100% Pt, 100% Au, 80% Pd/20% Pt, 100% Ag, 100% Ni, 100% Al and 100% Sn can be patterned onto the substrate surface to create circuitry components using these methods.

Electrical device components can be spray-deposited onto the substrates of the force sensor devices through stencils. Spray-deposition is quick and inexpensive, and can be applied at room temperature without specialized equipment. Also, because of its large coating thickness, spray deposition of metal can be used to build electrically conductive pathways on very rough surfaces including toilet paper, paper towel, or woven fabric. The spray is applied via an airbrush or an aerosol container consisting of flakes or particles of one or more conductive materials such as metals suspended in an acrylic base. In certain embodiments, electrical device components such as metals are spray-deposited onto the substrates through stencils made of metal, plastic, or photoresist. In certain other embodiments, conductive materials are spray-deposited onto the substrates through stencils made of metal or plastic based on a silkscreen soaked in photoresist. In one case, Ni or Ag is sprayed onto a substrate material and cured at room temp for ten minutes to produce an electrically conductive surface (thickness=20-100 microns depending on number of passes, surface resistance=0.7 Q/square for Ni, 0.01 Q/square for Ag).

Electrical device components can be squeegeed or screen printed onto the substrates of the force sensor devices through stencils. Non-limiting examples of electrical device components that can be squeegeed or screen printed onto the substrates include conductive adhesives, piezoresistive materials, or conductive inks (metal or conductive polymer based). Squeegee techniques can be used to deposit the electrical device component on the surface of the substrate material. In certain embodiments, conductive materials such as metals are squeegeed onto the substrates through stencils made of metal, plastic, or photoresist. In certain other embodiments, conductive materials are squeegeed onto the substrates through stencils made of metal or plastic based on a silkscreen soaked in photoresist.

Conductive materials can be deposited onto the substrates of the force sensor devices using an etching process through stencils. In certain embodiments the electrical device component is first deposited onto the substrate material by evaporation, sputter-deposition, spray-deposition, or squeegee. A stencil is then applied, and the portion of the electrical device component that is not protected by the stencil is etched, resulting in a pattern of the electrical device component on the substrate material.

Electrical device components can be deposited by drawing features on substrate material. For example, piezoresistive and conductive materials can be deposited onto the substrate surface using pens filled with piezoresistive or conductive metal inks. In certain embodiments, Ag, Ni, or conductive polymers are applied to the substrate material using a pen or drawing implement filled with an ink containing these materials. Drawing conductive pathways could deposit conductive materials both on the surface and inside the matrix of the substrates.

Electrical device components can also be deposited by inkjet printing, laser printing, or flexographic printing. In certain embodiments, electrical device components are printed or plotted by inkjet or laser printing. In certain other embodiments, a piezoresistive ink or a conductive ink is printed or plotted by inkjet or laser printing.

In yet other embodiments, electrical device components are deposited by attaching commercially available or homemade conductive or piezoresistive material tapes onto the substrate surface. For example, a conductive tape, such as a commercially available copper tape, can be applied to the surface to create a circuitry element. In certain other embodiments, a homemade conductive or piezoresistive tape is affixed onto the surface of the substrate material. Homemade piezoresistive or conductive tapes can be fabricated from a plastic tape, such as scotch tape, coated with one or more piezoresistive or conductive materials by evaporation, sputter deposition, spray-deposition or squeegee.

Conductive materials can be embedded in the pulp or fibers for manufacturing the substrate material to allow for manufacturing substrates with conductive materials deposited within. In certain embodiments, metals or other conductive materials are embedded in the pulp or fibers used for manufacturing paper.

In another aspect, electrical components are attached onto the substrates after the deposition of conductive materials. The electrical components can be attached using, e.g., known adhesives. In certain embodiments, a commercially available two-part conductive adhesive (Circuit Specialists Inc.) can be prepared by mixing equal volumes of the components in a Petri dish. This adhesive can be used immediately after mixing and is applied to the conductive material pathway using a syringe needle. Discrete electronic components are bonded to the metallic pathways by pressing the terminals of the electronic component on the adhesive. Non-limiting examples of electronic components include integrated circuits, resistors, capacitors, transistors, diodes, mechanical switches, and batteries.

After application, the electrical device component can be cured if necessary. The term "cured" as used herein shall refer to piezoresistive or conductive ink that has been reacted to stabilize the ink on the substrate material surface. In some cases, the piezoresistive or conductive ink may be cured using heat, radiation (i.e., UV), or chemical curing methods. Where elements meet on the substrate surface, the features may optionally contain a diffusion zone. For example, where an electrical contact and piezoresistive element meet, metal from the electrical contact may diffuse to form a mixture of metal and piezoresistive ink in zones around the interface between the electrical contact and the piezoresistive ink.

In some cases, the one or more of the features on the device is coated, for protection, with a layer of varnish, insulating polymer, or other protective material.

C. Post Patterning Fabrication

In some cases, two-dimensional force sensors are further modified into a three-dimensional sensor in one or more post-patterning fabrication steps.

1. Three-Dimensional Folding for Rigidity Modification

In some embodiments, the two dimensional force-sensing devices are folded, creased, or pleated to increase rigidity.

2. Three-Dimensional Folding—Array Fabrication

In some embodiments, multiple two-dimensional force-sensing devices are arranged in a 3-dimensional configuration. For example, multiple 2D sensors are arranged orthogonally so as to measure force along more than one axis simultaneously. Preferably, a two-dimensional array of sensors is fabricated on a paper substrate, which is subsequently folded into a 3D structure to presents three sensors orthogonally. In this way, the MEMS-device is able to simultaneously sense force along three orthogonal directions (x-y-z).

D. Automated Production

The paper-based sensors can be mass produced by incorporating highly developed technologies for automatic paper cutting, folding, and screen-printing. In one embodiment the sensors are printed on a roll which is then applied in a manner similar to labels, with pre-applied or simultaneously applied adhesive. In another embodiment, the sensors are applied at the time of manufacture, for example, when air bags in a car are assembled, toys built, or shipping containers assembled.

IV. Methods of Use

The devices described above can be utilized in any application where similar MEMS sensors have proven useful. The force sensors described herein can be used as, or used to fabricate, accelerometers, pressure sensors, tactile sensors, and flow sensors.

The force sensors can be incorporated into, for example, medical devices, industrial controls, automotive components, fitness products, toys, athletic equipment, protective equipment such as helmets and pads, robotics, packaging materials, and assistive technology.

Owing to their low cost, portability, and disposability, devices disclosed herein may be particularly suitable for single-use sensors in analytical applications (e.g., mechanical characterization of tissues in medical diagnostics and measurement of viscosity of foods products during production, or incorporation into or use in conjunction with microfluidic devices, such as those disclosed in U.S. Patent Application No. US 2011/0111517 to Siegel, et al. and US Patent Application No. US 2011/0123398 to Carrilho, et al.).

Figures 18A, 18B, 18C:
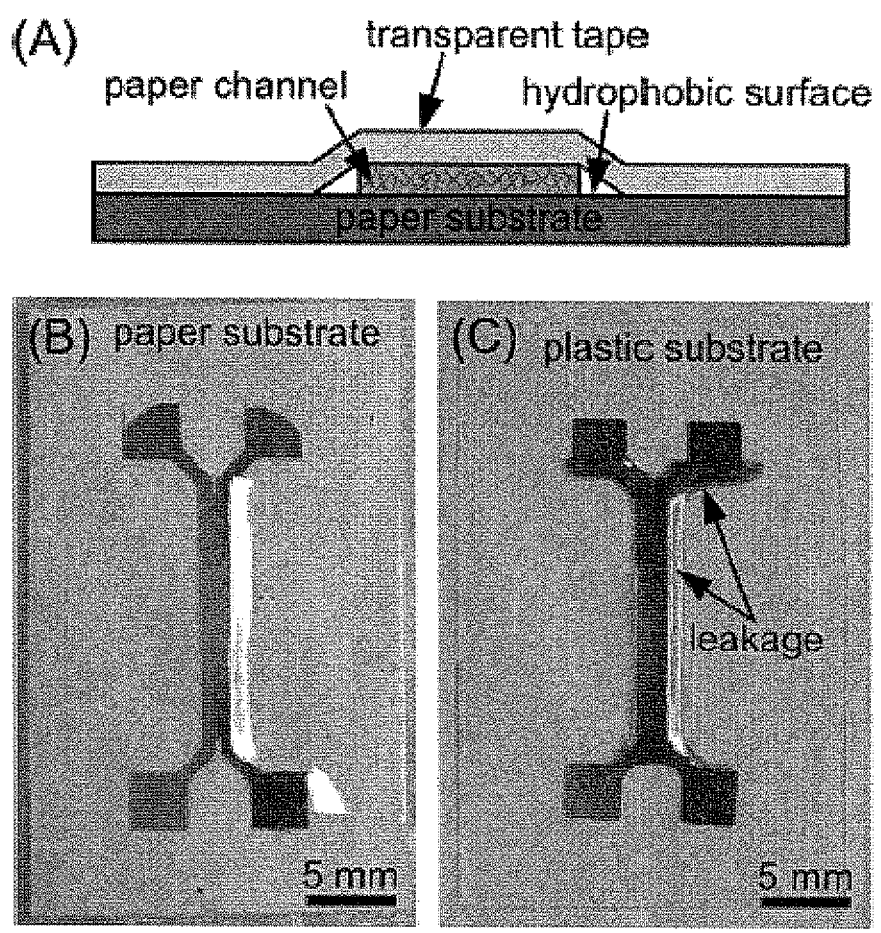
FIGS. 18A-C show a microfluidic device using a hydrophobic paper substrate as the barrier to confine fluids in the paper channel.

FIGS. 18A-B show a microfluidic device using a hydrophobic paper substrate as the barrier to confine fluids in the paper channel. FIG. 18A shows a schematic diagram of cross-section view of the microfluidic device. FIGS. 18B and 18C Photographs of devices constructed using (18B) a hydrophobic paper substrate and (18C) a hydrophilic plastic substrate.

Using many paper, wood, and fabric substrates, MEMS devices can be fabricated which are substantially biodegradable. Substantially biodegradable, as used in this context, refers to a MEMS device which in constructed using a biodegradable substrate material. Preferably, the biodegradable substrate material decomposes, for example, when placed in moist soil for a period of one year, more preferably six months, more preferably thirty days.

The present invention will be further understood by reference to the following non-limiting examples.

Example 1

Fabrication of a Paper-Based Piezoresistive Force Sensor

FIG. 1A shows a schematic diagram of a simple, paper-based force-sensing cantilever. In this device, a carbon resistor is located at the root of the cantilever, where the maximum surface strain occurs during detection. The carbon resistor was designed to be short (7 mm) relative to the length (44.5 mm) of the cantilever. When a force is applied to the beam structure, the resistor experiences a mechanical strain/stress, which then induces a change in resistance of the resistor. Measuring the change in resistance allows quantification of the applied force.

Figure 1B:
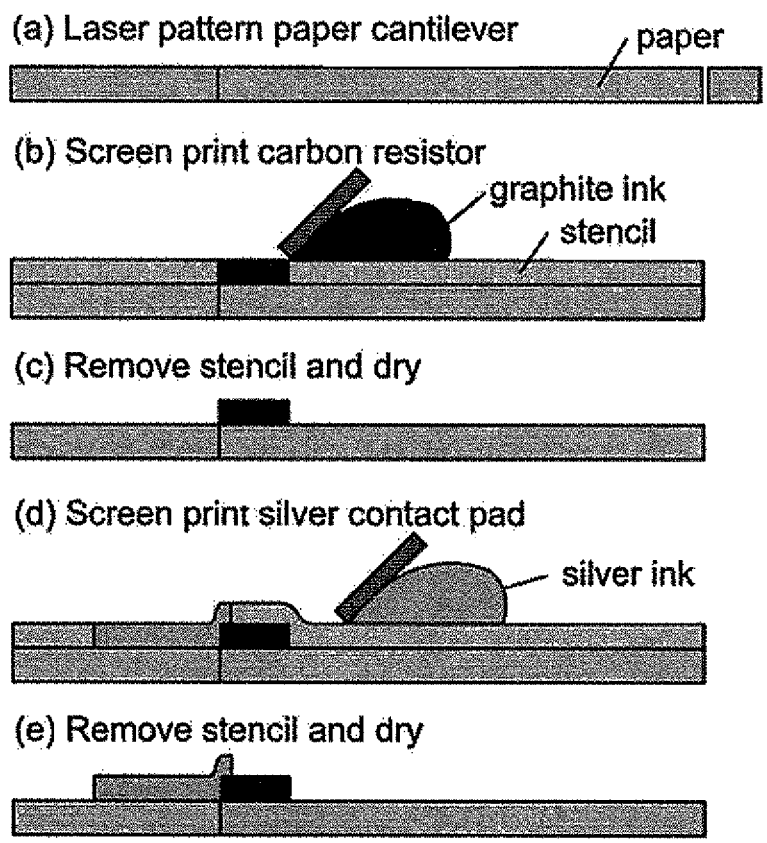
Figure 1C:
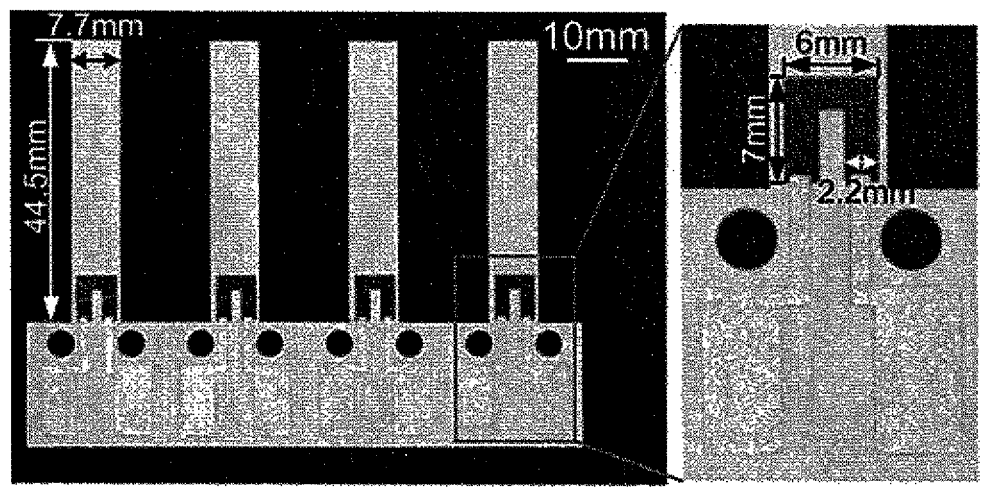

The fabrication of the cantilever beam force sensor is illustrated in FIG. 1B. Whatman® 3 MM chromatography paper (catalog number: 3030-6185, 340 μm thick, 186 g/m$^{-2}$) was selected as a paper substrate for purposes of initial investigation. To render the paper hydrophobic, the surface hydroxyl groups of the paper were functionalized (cellulose fibers) with (tridecafluoro-1,1,2,2-tetrahydrooctyl)trichlorosilane vapor to form surface silanol linkages, resulting in a fluorinated, highly textured, hydrophobic surface. Using a goniometer, the contact angle of water on the silanized paper surface was measured at 140°.

After treatment, the silanized paper was cut to form the cantilever beam (44.5±0.1 mm long and 7.7±0.08 mm wide) extending from the center of one edge of a square platform (approximately 15 mm by 15 mm) using a laser cutter (VersaLASER VLS3.50, Universal Laser Systems, Inc, Scottsdale, Ariz.). The precision of the laser cutting was 0.1 mm.

Vinyl stencil film (Grafix® Frisket film) was laser cut to fabricate stencils for screen printing of the piezoresistive material and electrical contacts on the surface of the silanized paper substrate.

Figure 9:
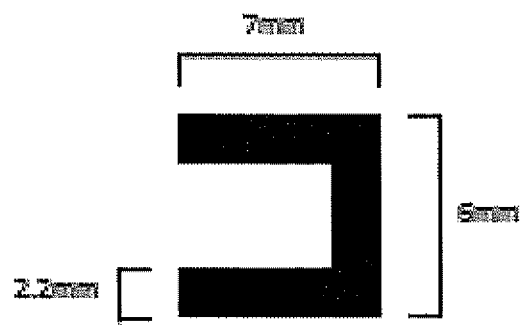
FIG. 9 shows the shape and dimension of an exemplary piezoresistive carbon resistor.

The stencil for the photoresistive material contained a "U"-shaped opening, as shown in FIG. 9, with an overall length of approximate 7 mm, an overall width of approximately 6 mm, and a line width of approximately 2.2 mm. The stencil for the photoresistive material was visually aligned with the paper cantilever and placed on the surface of the paper cantilever. The openings of the stencil were filled with a graphite ink (E3456, Ercon Inc., Wareham, Mass.) using a screen-printing process. The mask was removed, and the device was dried on a hotplate at 60° C. for 20 minutes.

Using a similar procedure, two electrical contacts were screen-printed on the square platform using silver ink. The electrical contacts were patterned so as to overlap the ends of piezoresistive material, as shown in FIG. 1C.

Mechanical Properties of Paper Cantilever Beams

The stiffness of the cantilever beams fabricated from silanized 3 MM chromatography paper was characterized using a precision balance (FIG. 10) (Ohaus Explorer® Pro, model EP64, Parsippany, N.J.). The paper-based force sensor was mounted onto a three-degree-of-freedom (3-DOF) positioner that was used to move the sensor in contact with the precision balance so as to deflect the cantilever beam in a controlled fashion. Change in the resistance of the carbon resistor was measured using a LCR (L: inductance, C: capacitance, and R: resistance) meter.

Figure 2A:
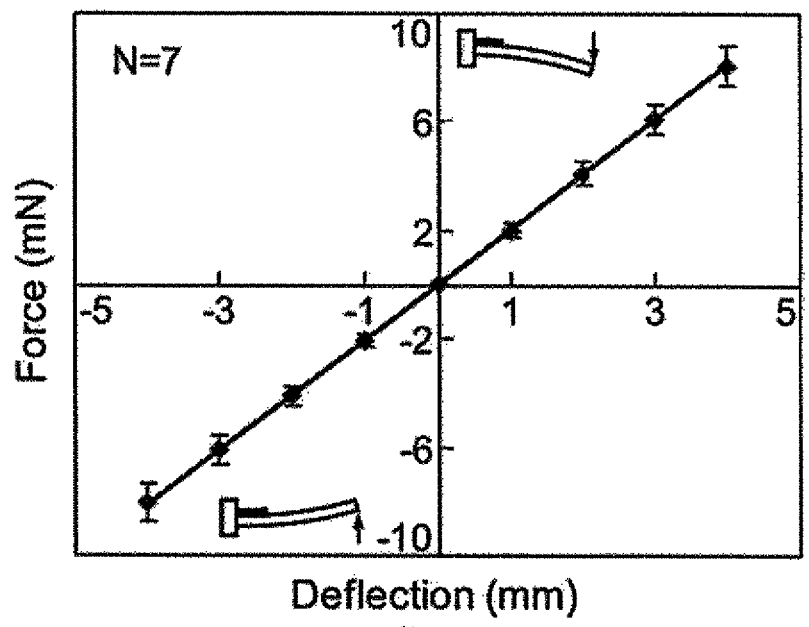
FIGS. 2A-B shows the mechanical properties of paper cantilever beams.

The force applied to the free end of the cantilever beam as a function of beam deflections was measured using the precision balance. FIG. 2A shows the force-deflection data based on the measurement of seven devices. The stiffness of the cantilever beams fabricated from silanized 3 MM chromatography paper was determined to be 2.0±0.16 mN mm$^{-1}$ (mean±one standard deviation).

Using the laser cutting methods described above, cantilever beams of identical dimensions (44.5±0.1 min long and 7.7±0.08 mm wide) were fabricated using seven alternative paper substrate materials. Using an identical methodology, the stiffness of the cantilever beams fabricated from different substrate materials was measured. The results are shown in Table 1. The results demonstrate that the beam stiffness can be tuned over a wide rage through the selection of substrate materials of different thicknesses, rigidity, and composition.

TABLE 1

Beam stiffness measured for cantilever beams fabricated using eight different types of paper.

| Paper Type | Thickness (mm) | Grammage (g/m$^2$) | Beam Stiffness (mN/mm) |
|---|---|---|---|
| Staples ® Copy Paper | 0.1 | 75 | 0.065 |
| OfficeMax ® Copy Paper | 0.11 | 75 | 0.067 |
| Vellum Paper | 0.09 | 112 | 0.1 |
| 1 mm chromatography paper | 0.18 | 84 | 0.14 |
| Ivory Paper | 0.17 | 120 | 0.27 |
| Card Stock Paper | 0.24 | 199 | 0.8 |
| HP ® Photo Paper | 0.25 | 240 | 1.3 |
| 3 mm chromatography paper | 0.34 | 186 | 2.0 |

Figure 2B:
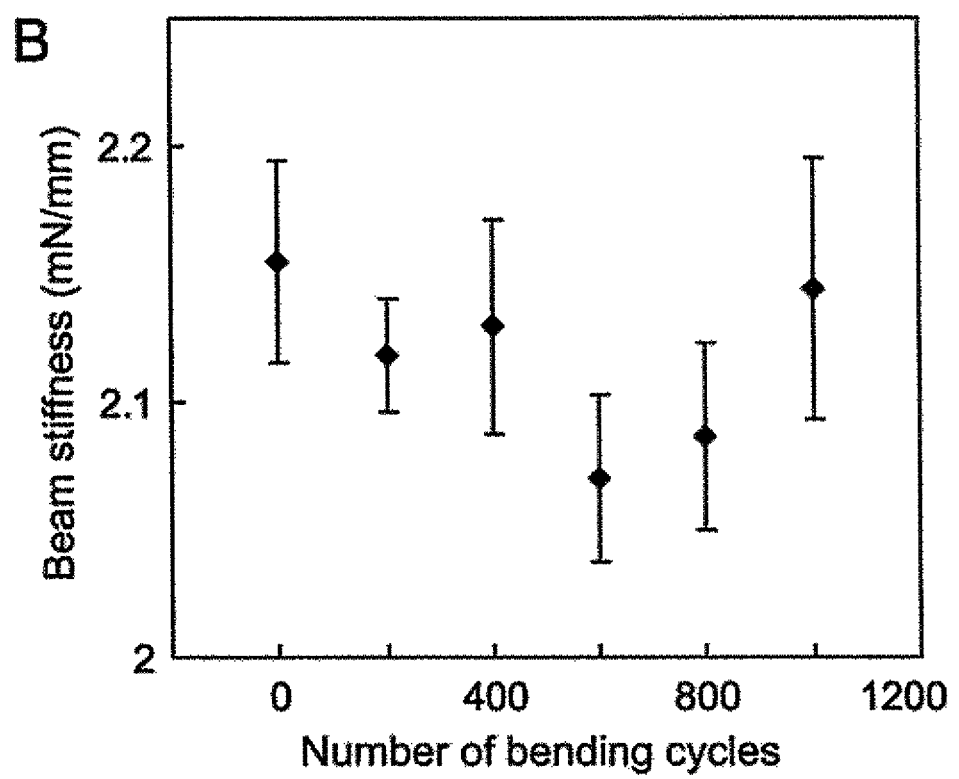

The mechanical reliability of the paper force sensor formed using a silanized paper substrate was also evaluated through repeated bending of a cantilever beam up to 1000 times. After every 200 cycles of bending, the force-deformation curves for the paper cantilever were measured seven times as described above, and the average beam stiffness was calculated based on the data from the seven measurements. FIG. 2B shows data characterizing beam stiffness as a function of the number of bends. The change of the beam stiffness during the 1000 cycles of bending is <4%. These data demonstrate stable mechanical properties (stiffness) of the paper cantilever beams, and suggest that silanized (hydrophobized) paper is a suitable structural material for conducting MEMS devices.

To compare the stiffness of paper with that of other materials for constructing MEMS devices, the Young's modulus was used to estimate of the paper beam, based on the data of force-deformation curves (FIG. 2A). We calculated the Young's modulus of the paper using a beam equation (eqn (1)), with the assumption that paper is a solid and homogeneous material:

$$E=(4FL^3)/(\delta WH^3) \qquad \text{Equation 1}$$

Here, E is the Young's modulus (in kPa) of the paper, F is the force (in N) applied to the free end of paper beam, d is the detection (in mm) of paper beam, and L, W, and H are length, width, and thickness (in mm) of the beam respectively. The Young's modulus of the paper was determined to be 2.0±0.17 GPa (N=7), which is approximately 66 to 86 times lower than that of silicon (130-170 GPa for single crystal silicon). Because paper is porous, the value of Young's modulus is not the Young's modulus of cellulose itself (fibers of which form the paper), but an equivalent to Young's modulus for the paper in the format of a porous sheet.

Electrical Properties of Carbon Resistors

The current-voltage (I-V) characteristic was measured of the carbon resistor using a source meter (Keithley 2400). All the measured resistors (N=7) revealed a linear, ohmic I-V behavior (FIG. 3A), indicating that the piezoresistivity of the carbon resistor correlates primarily with the strain-induced shape deformations of the resistor. The resistance of the resistors we tested was 600 190 U (N=7).

Figures 3A, 3B:
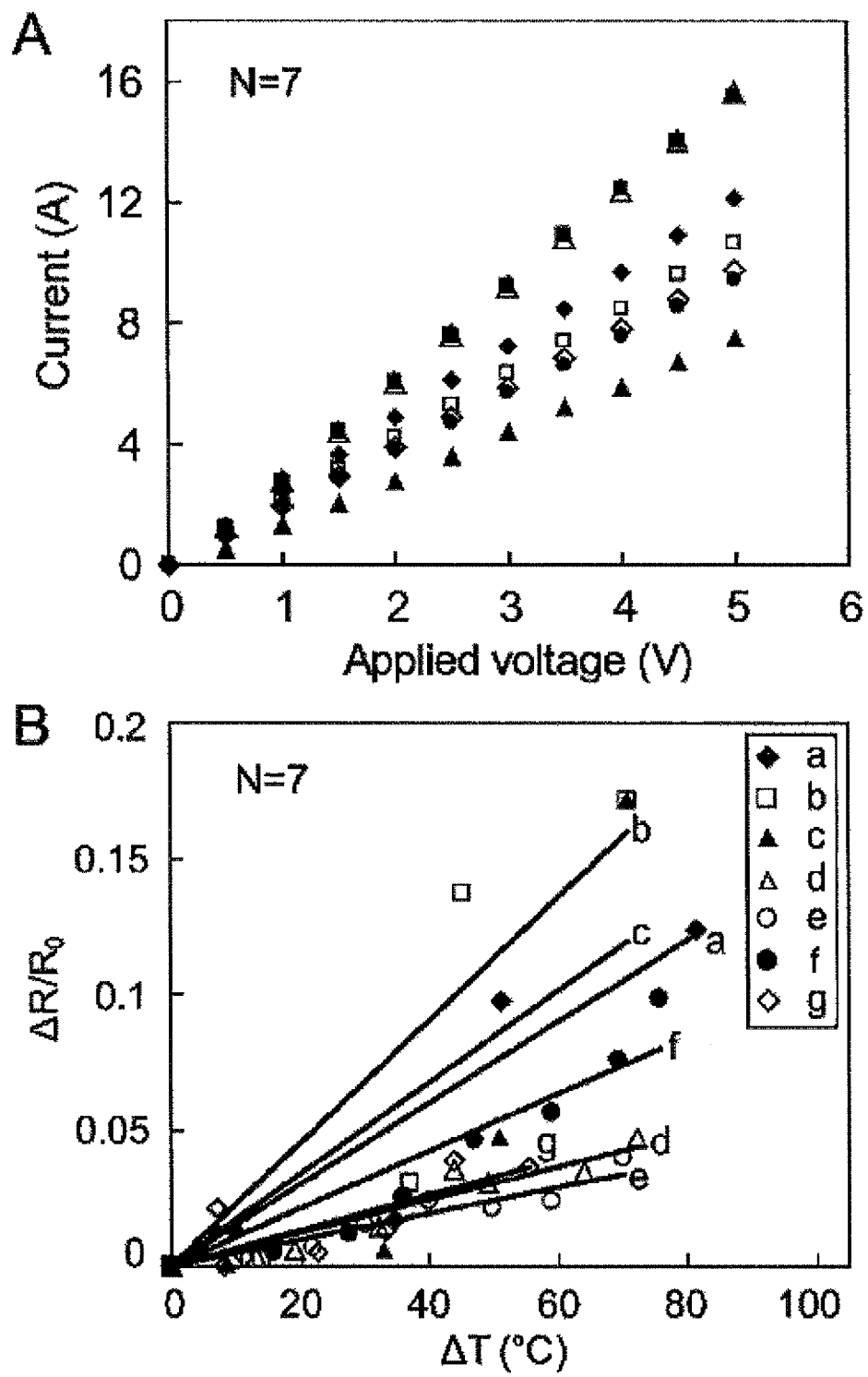
FIGS. 3A-B shows the electrical properties of carbon resistors.

The temperature coefficient of resistance of the carbon resistors was also determined. This coefficient is defined as the ratio of relative change in resistance of a resistor ($\Delta R/R_0$) to the change in temperature ($\Delta T$). FIG. 3B shows the relative change in resistance of the carbon resistors as a function of the change in temperature. These data yield a temperature coefficient of resistance of 0.0012±0.0007 per C.° (N=7). The effect of temperature on the output of the sensor could, in principle, be cancelled by laying out another carbon resistor on the cantilever for temperature compensation and integrating it into the circuit for signal readout (i.e., in a Wheatstone bridge circuit, or some equivalent circuit).

Sensor Calibration

Figure 10:
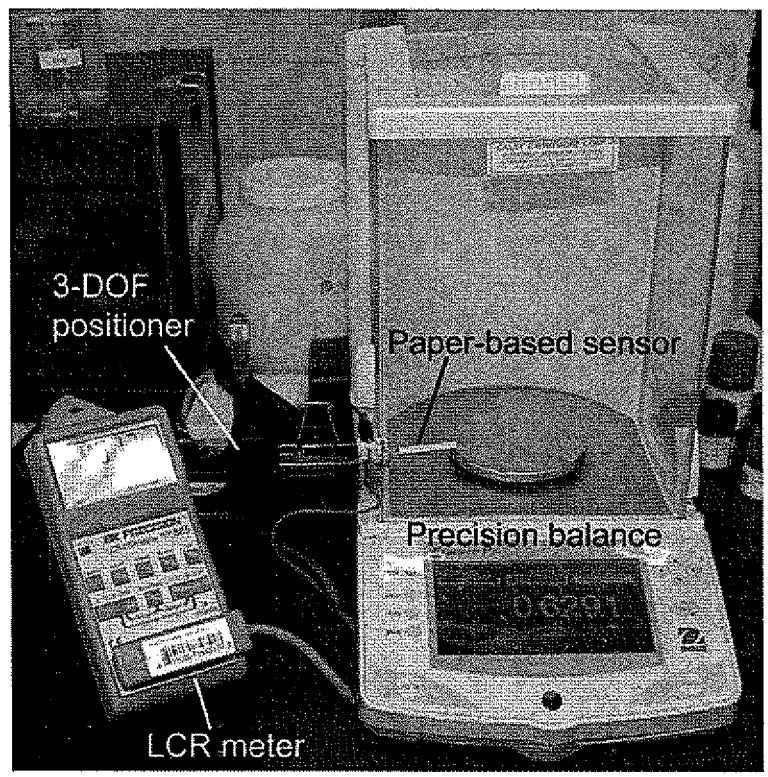
FIG. 10 shows the setup for sensor calibration. A paper-based sensor was mounted onto a three-degree-of-freedom (3-DOF) positioner that was used to move the sensor to contact a precision balance. The precision balance was for measuring forces applied to the free end of sensor beam. Resistance changes of the carbon resistor were measured by a LCR (L: inductance, C: capacitance, and R: resistance) meter.

The paper-based force sensors was measured using a precision balance and a LCR (L: inductance, C: capacitance, and R: resistance) meter (model 885, BK Precision). FIG. 9 shows the shape and dimension of an exemplary piezoresistive carbon resistor. FIG. 10 shows the setup for sensor calibration. A paper-based sensor was mounted onto a three-degree-of-freedom (3-DOF) positioner that was used to move the sensor to contact a precision balance. The precision balance was for measuring forces applied to the free end of sensor beam. Resistance changes of the carbon resistor were measured by a LCR (L: inductance, C: capacitance, and R: resistance) meter.

Figures 11A, 11B:
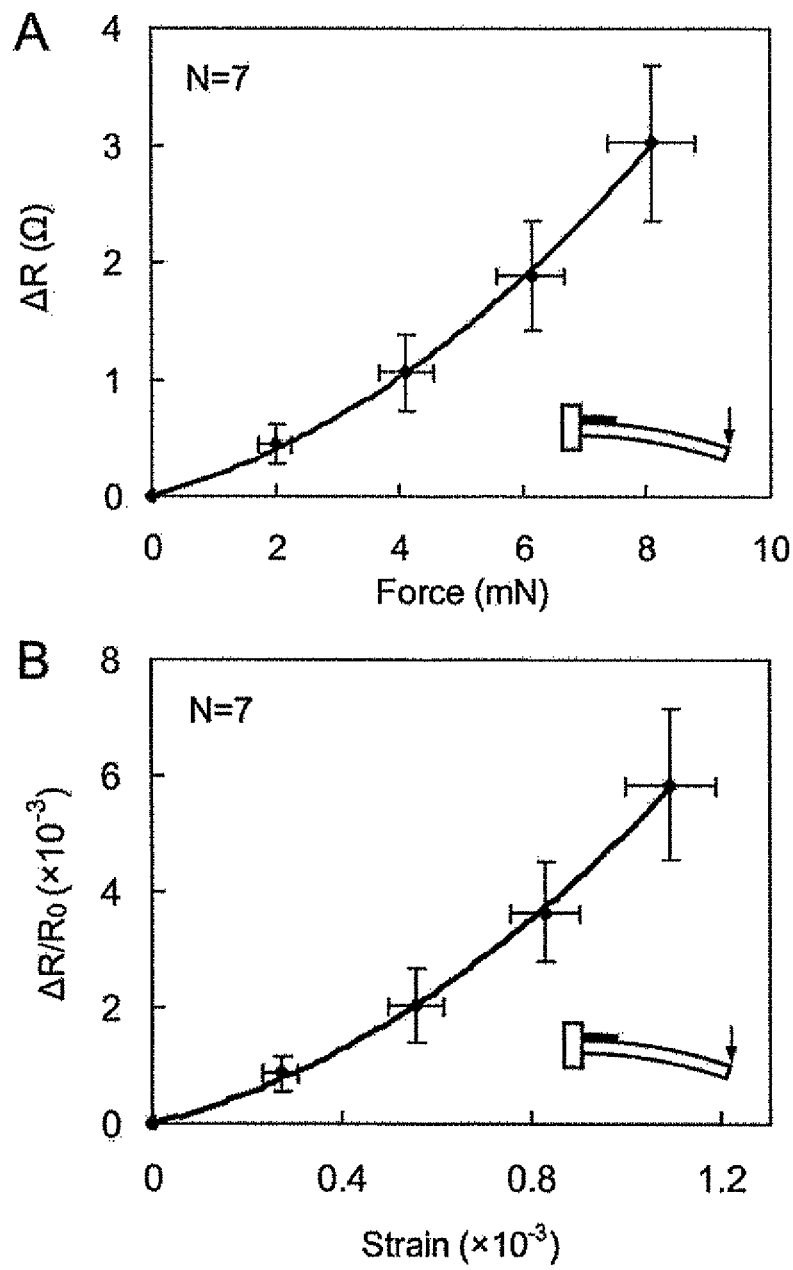
FIGS. 11A-B shows sensor calibration data for carbon resistors under stretching strain shows a nonlinear behavior. Error bars in all figures represent one standard deviation.

FIGS. 11A-B shows sensor calibration data for carbon resistors under stretching strain shows a nonlinear behavior. Error bars in all figures represent one standard deviation. FIG. 11A shows a calibration plot of the output (resistance change) of the sensor as a function of the input (applied force), based on measurement of seven devices. The solid line represents a second-order polynomial fit to the experimental data with a regression equation: y=0.028x2+0.14x ($R^2$=0.999, N=7). FIG. 11B shows a calibration plot of the relative change in resistance as a function of the applied strain. The solid line represents a second-order polynomial fit to the experimental data with a regression equation: y=3300x2+2.3x ($R^2$=0.999, N=7).

Figures 4A, 4B:
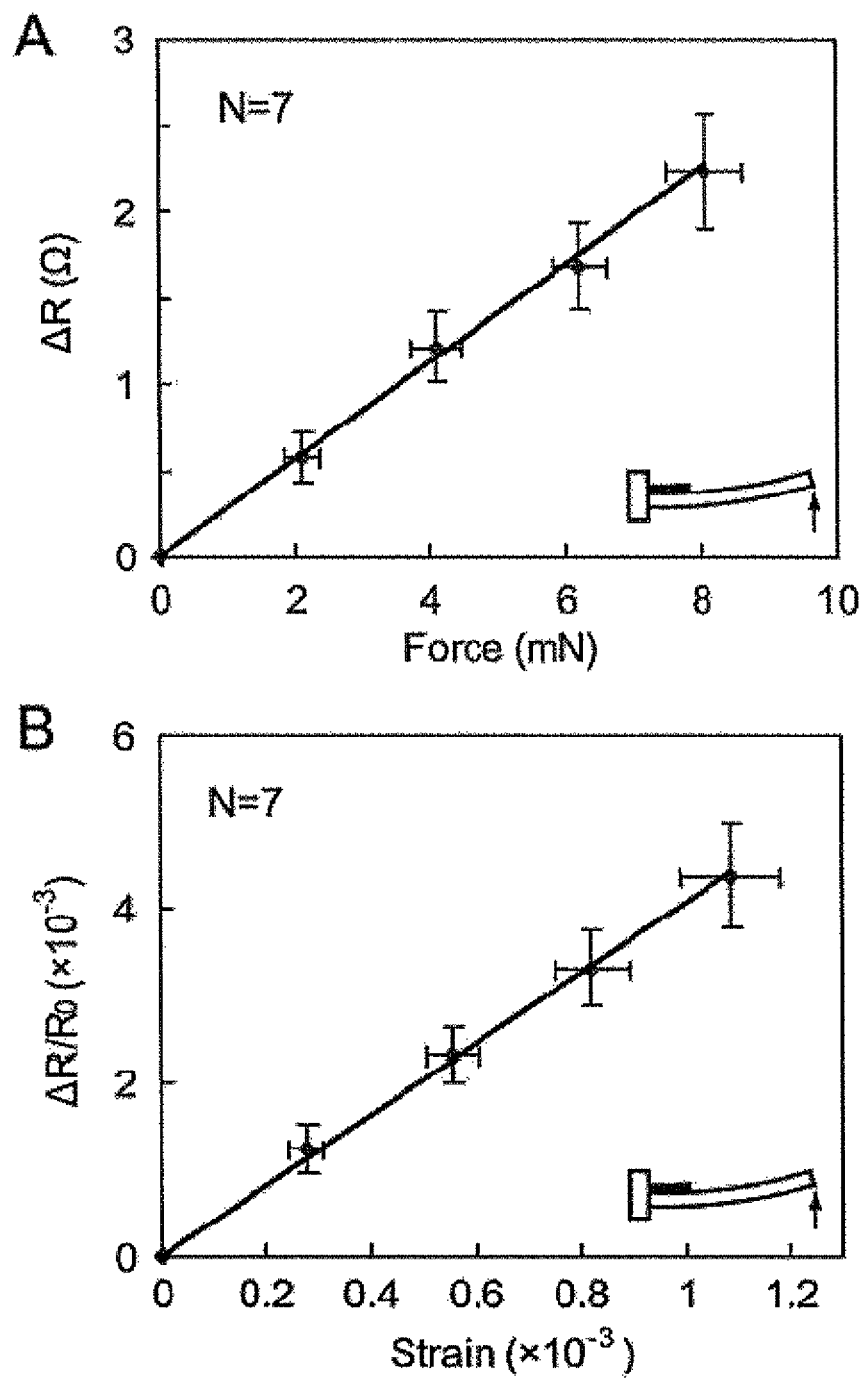
FIGS. 4A-B show the calibration of the paper-based force sensor when the carbon resistor is under compressive strain.

FIG. 4A shows the output of the sensor (i.e., the change in resistance) as a function of the input to the sensor (i.e., the force applied to the free end of a paper beam) when the carbon resistor was under compressive strain. The resistance changes linearly with the applied force. Based on the calibration curve (FIG. 4A), the range of force measurement was determined to be ±16 mN, and the resolution of force measurement (detection limit) was 0.35 mN (corresponding to the detection limit of the LCR meter: 0.1Ω). The sensitivity of the sensor (i.e., the slope of the curve of linear regression in FIG. 4A) was 0.29 $\Omega mN^{-1}$. With the current experimental system, the resolution of force measurement was primarily limited by the resolution of the resistance measurements (0.1Ω) obtained using the LCR meter. Using a high-resolution LCR meter, or integrating a signal-processing circuit to read the change in resistance more accurately, would increase the resolution of force measurement.

Interestingly, and for reasons that remain unclear, the force sensor showed a nonlinear response (FIGS. 11A and 11B) when the carbon resistor was stretched rather than compressed. Second-order polynomial equations fitted the experimental data well ($R^2$>0.99). Since a linear sensor response is desired in most force-sensing applications, only the paper-based sensor was used in the mode that places the carbon resistor under compressive strain (called 'compressive mode'). The results in this example were obtained by operating the sensor in the compressive mode.

The "gauge factor" of the piezoresistive sensor was calculated; the gauge factor is defined as the ratio of relative change in resistance of the resistor ($\Delta R/R_0$) to the applied mechanical strain ($\epsilon$). A higher gauge factor indicates higher sensitivity for the sensor. FIG. 4B shows that the relative resistance changed linearly with the applied strain; the gauge factor was 4.1.

Figures 12A, 12B:
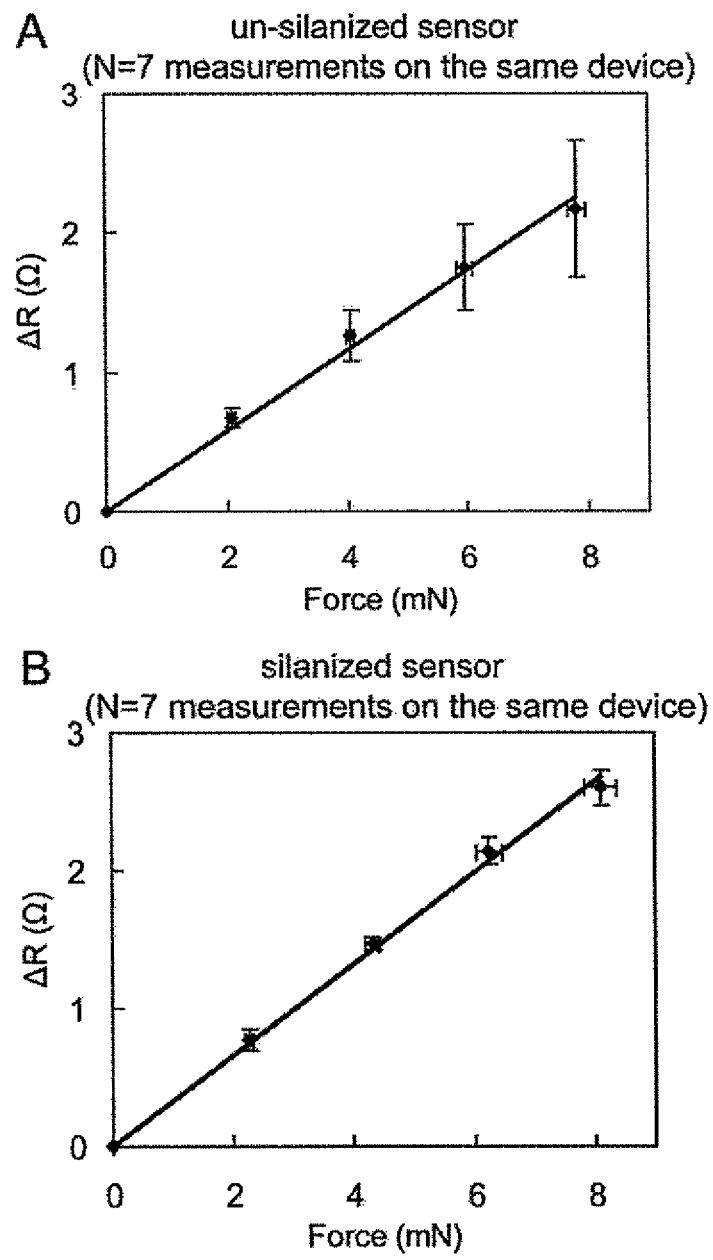
FIGS. 12A-B shows calibration plots of resistance change as a function of applied force based on seven measurements on a sensor.

The reproducibility of the performance was also quantified of paper-based sensors with and without silanization by calibrating a sensor seven times. FIGS. 12A and 12B show the calibration data collected from an un-silanized sensor (FIG. 12A) and a silanized sensor (FIG. 12B). The silanized sensor generated more reproducible output than the un-silanized sensor, probably because the silanization of paper surface minimizes the effect of environmental humidity on the output (change in resistance) of the sensor.

Folding of the Paper Cantilever

Figures 5A, 5B:
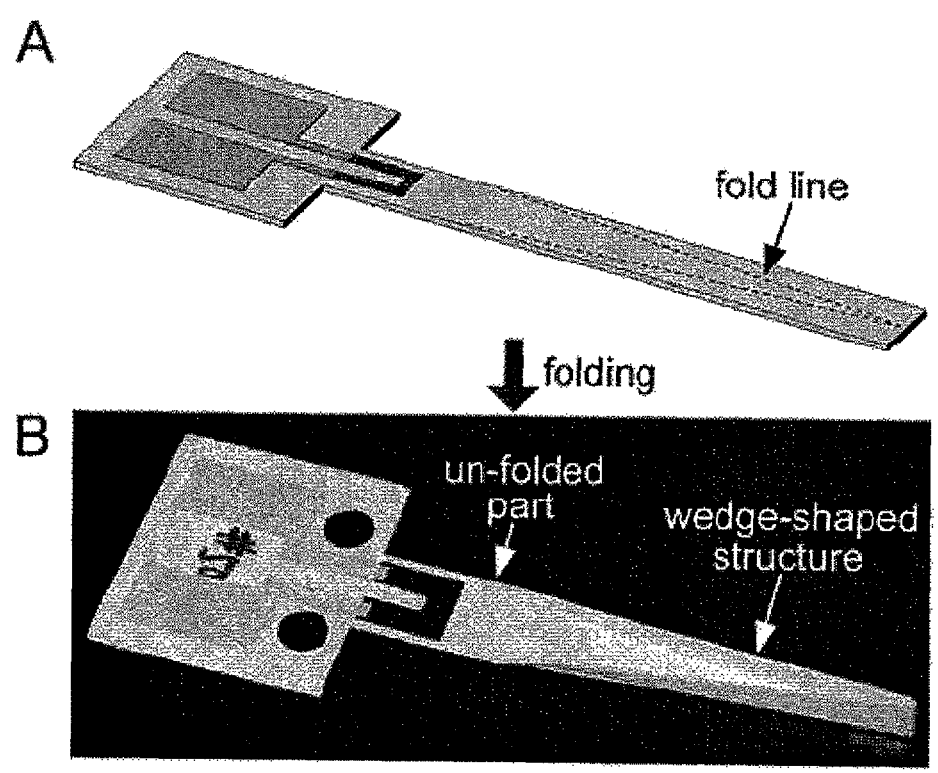
FIGS. 5A-D show that the folding of the paper cantilever beam increases stiffness of the beam and the sensitivity of the sensor.
Figures 5C, 5D:
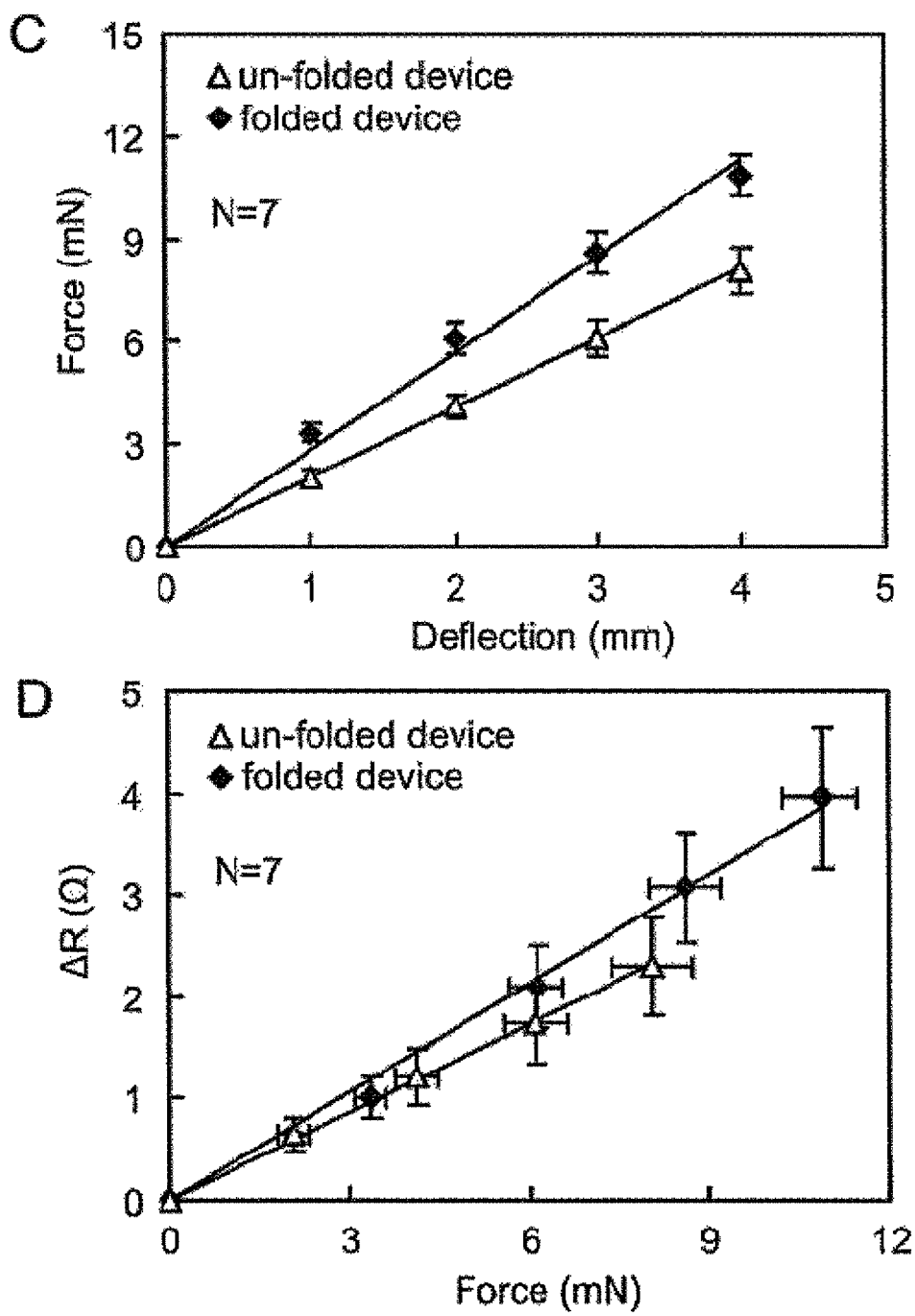

One characteristic of the paper not shared by silicon or quartz is that paper can be folded into three-dimensional structures; this characteristic makes it straightforward to increase the stiffness of the paper sensor while keeping it light. The folding of a paper cantilever beam with the same dimensions as above was tested. As shown in FIG. 5A, dashed fold lines on the paper was made on the cantilever beam using a laser cutter, followed by folding the beam to form a wedge-shaped structure (FIG. 5B) that is stiffer than the un-folded part of the beam. This folding enhanced the stiffness of the cantilever beam without increasing the weight of the beam. FIG. 5C shows the force-detection curves of the folded and un-folded beams (N=7); the stiffness (2.8 mN $mm^{-1}$) of the folded beam is 40% higher than that of the un-folded beam (2.0 mN $mm^{-1}$). The folding of the cantilever beam concentrated mechanical strain on the carbon resistor, and thus increased the sensitivity of the sensor. FIG. 5D shows calibration plots of the output (change in resistance) of the folded sensor as a function of the input (force applied to the free end of the beam) to the sensor. The sensitivity of the folded sensors was 0.36 $\Omega mN^{-1}$; this value is 24% higher than the sensitivity (0.29 $\Omega mN^{-1}$) of the un-folded sensors.

Monolithic Integration of a Signal-Processing Circuit onto the Paper Device

In order to convert the change in resistance of the sensor into a more readable electrical signal (voltage), a Wheatstone bridge circuit (FIG. 6A) is commonly used for signal processing in MEMS piezoresistive sensing systems. There are two ways in conventional MEMS to integrate signal-processing circuits with the MEMS sensor: (i) a two-chip approach, where a MEMS device is mounted on a printed circuit board (PCB) on which the signal processing circuit is laid out; the electrical connection is achieved using wire-bonding (Kim, et al. *Micromech. Microeng.,* 2008, 18, 055013). (ii) A monolithic approach, where a MEMS device and a conventional IC signal processing circuit (e.g., complementary metal oxide semiconductor—CMOS) are microfabricated on the same silicon chip (e.g., CMOS-MEMS) (Baltes, et al. *IEEE Conf Micro Electro Mechanical Systems,* 2002, pp. 459-466). The monolithic approach provides a smaller footprint for the chip, and much lower noise levels, but is more complicated to fabricate.

For the paper-based MEMS sensors, a monolithic approach was developed that integrated the Wheatstone bridge circuit with the paper-based sensor. This approach was inspired by a previous disclosure (Siegel, et al., *Adv. Funct, Mater.,* 2010, 20, 28-35), which used paper as a flexible PCB for construction of circuits. Connections of the entire Wheatstone bridge circuit were laid out (including the carbon resistor $R_s$ in FIG. 6B) by screen-printing silver ink on the base of the paper-based sensor, then gluing three surface-mount resistors ($R_1$, $R_2$, $R_3$) at appropriate locations, and finally 'soldering' them into the circuit using silver ink. $R_3$ is an adjustable resistor that is used to initially balance the Wheatstone bridge.

Figures 6A, 6B, 6C:
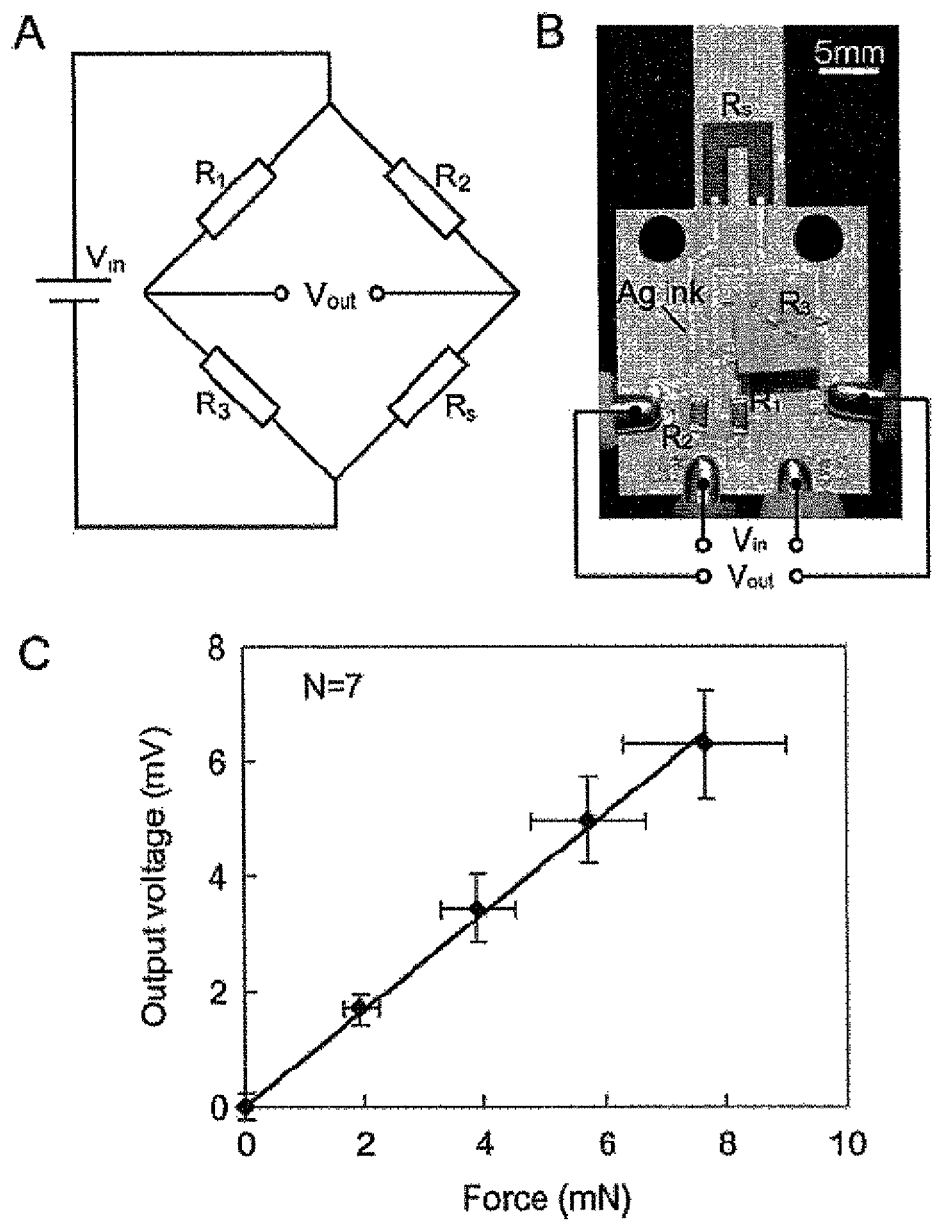
FIGS. 6A-C shows the monolithic integration of a Wheatstone bridge circuit with the paper-based sensor.
Figures 7A, 7B:
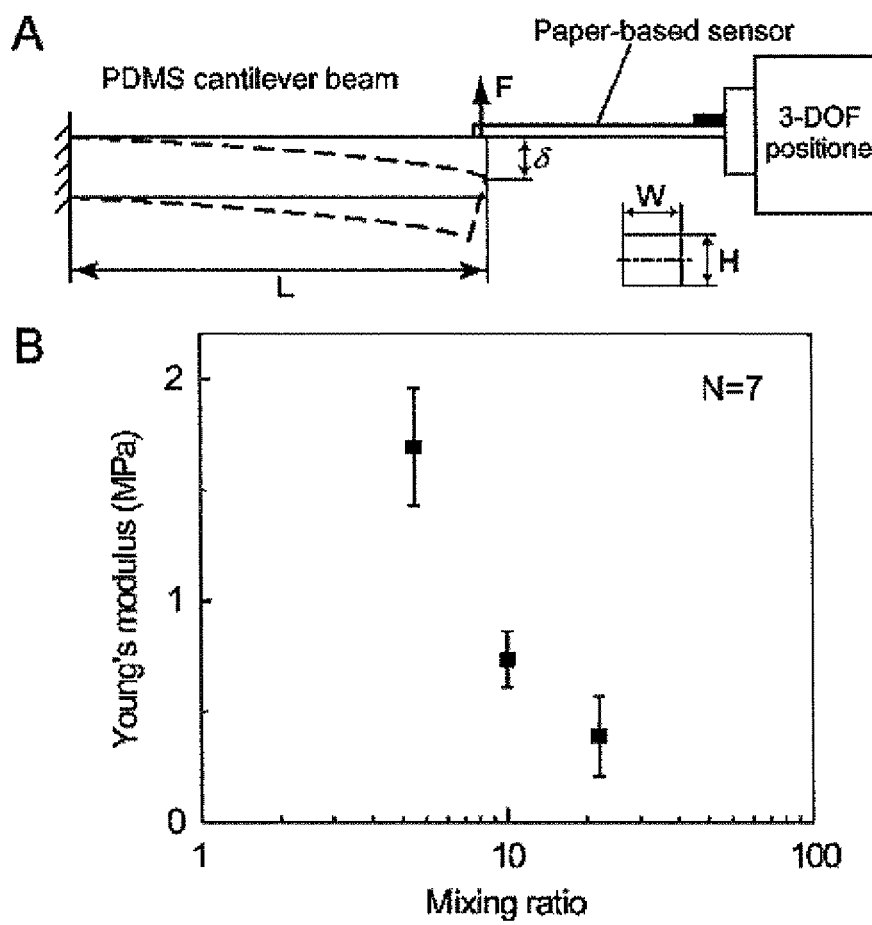
FIGS. 7A-B show the mechanical characterization of polydimethylsiloxane (PDMS) using a paper-based force sensor.

FIG. 6C illustrates a calibration curve of the paper-based sensor with an integrated Wheatstone bridge circuit. The resolution of the force measurement was improved to 120 μN (corresponding to a voltage detection limit of 0.1 mV). The sensitivity of the sensor after integrating a Wheatstone bridge circuit was 0.84 mV mN$^{-1}$.

Comparison of the Paper-Based Sensor with a Commercial Silicon-Based MEMS Sensor Table 2 lists specifications of a commercial MEMS silicon force sensor (AE-801, Kronex Technology, specifications provided by the manufacturer) and the paper-based force sensor; both sensors are based on piezoresistive sensing. The commercial sensor is manufactured in silicon using standard micro-fabrication technology. Because the Young's modulus of the paper is much lower than silicon, the paper-based MEMS sensor has a low natural resonant frequency (~25 Hz); this value indicates that the paper-based sensor could be used only for detection of low frequency or static forces. The paper-based sensor has a lower force measurement range, resolution, and sensitivity than the commercial silicon-based sensor, but it has low cost, and requires only simple fabrication. In terms of fabrication and cost, the paper-based sensor may provide a simpler and less expensive solution for some force sensing applications than a silicon-based sensor: silicon and paper based MEMS will probably be complementary rather than competitive technologies.

Example 2

Smart Paper Cube: a Three-Axis MEMS Accelerometer

Paper was used as the structural material for constructing a three-axis MEMS accelerometer. The device measures accelerations based on the principle of piezoresistive effect generated by conductive materials patterned on a paper structure. Three one-axis piezoresistive sensing elements and their readout circuits are first laid out on a piece of patterned paper, and the paper is then folded to form a cube (which we call "smart paper cube"). The three sensing elements are configured on the paper substrate in such a fashion that they locate on three orthogonal surfaces of the paper cube after folding.

Figures 8A, 8B, 8C:
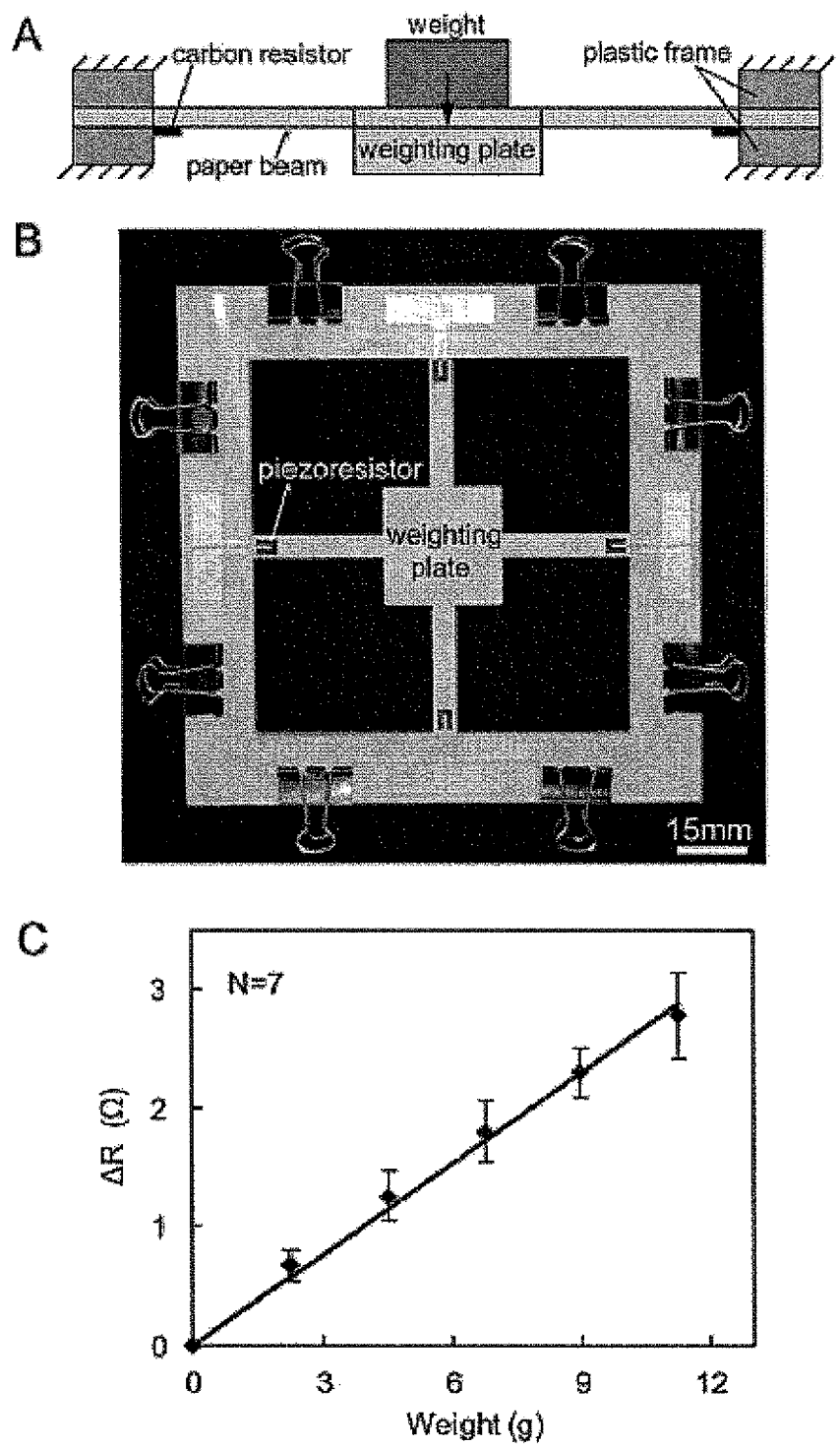
FIGS. 8A-C show a paper-based weighing balance.

FIGS. 8A-C show a paper-based weighing balance. FIG. 8A shows a schematic side view of a paper-based balance where force-sensing beams with carbon resistors are used for tethering a weighing plate, and measuring the force due to gravity of a weight. FIG. 8B shows the paper-based balance where four force sensing beams are involved. FIG. 8C shows a calibration plot of the resistance change from one sensing beam as a function of applied calibration weight. The solid line represents a linear fit to the experimental data with a regression equation: y=0.26×(R$^2$=0.993, N=7).

Figures 13A, 13B:
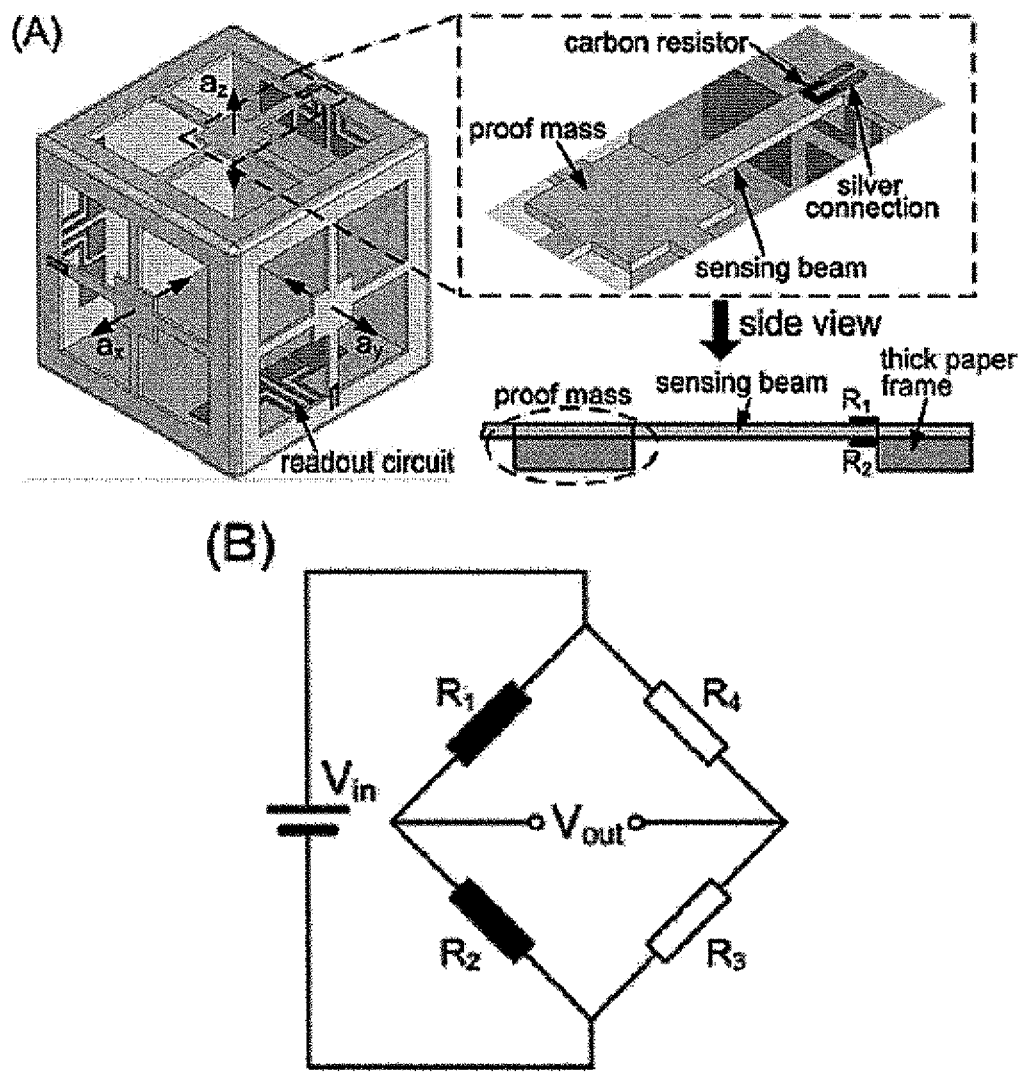
FIGS. 13A-B shows paper-based piezoresistive three-axis accelerometer.

FIG. 13A shows the schematic diagram of a paper-based three-axis accelerometer. In this device, three piezoresitive sensing elements are configured on three surfaces of a paper cube, and therefore can measure accelerations along three orthogonal directions (x-y-z). In each sensing element, four paper beams are used to tether a central proof mass, and two carbon resistors are patterned at the root of one of the four paper beams (on the top and bottom surfaces of the beam). When the device experiences acceleration along any of the three axes, an inertial force will be applied to the central mass and therefore deflect the paper beams; the carbon resistors will then undergo mechanical stress/strain and have resultant change in resistance. By measuring the change in resistance of the carbon resistor using the readout circuit (Wheatstone bridge in this work, as schematically shown in FIG. 13B), the applied acceleration can be detected.

Fabrication Process

Figure 14A:
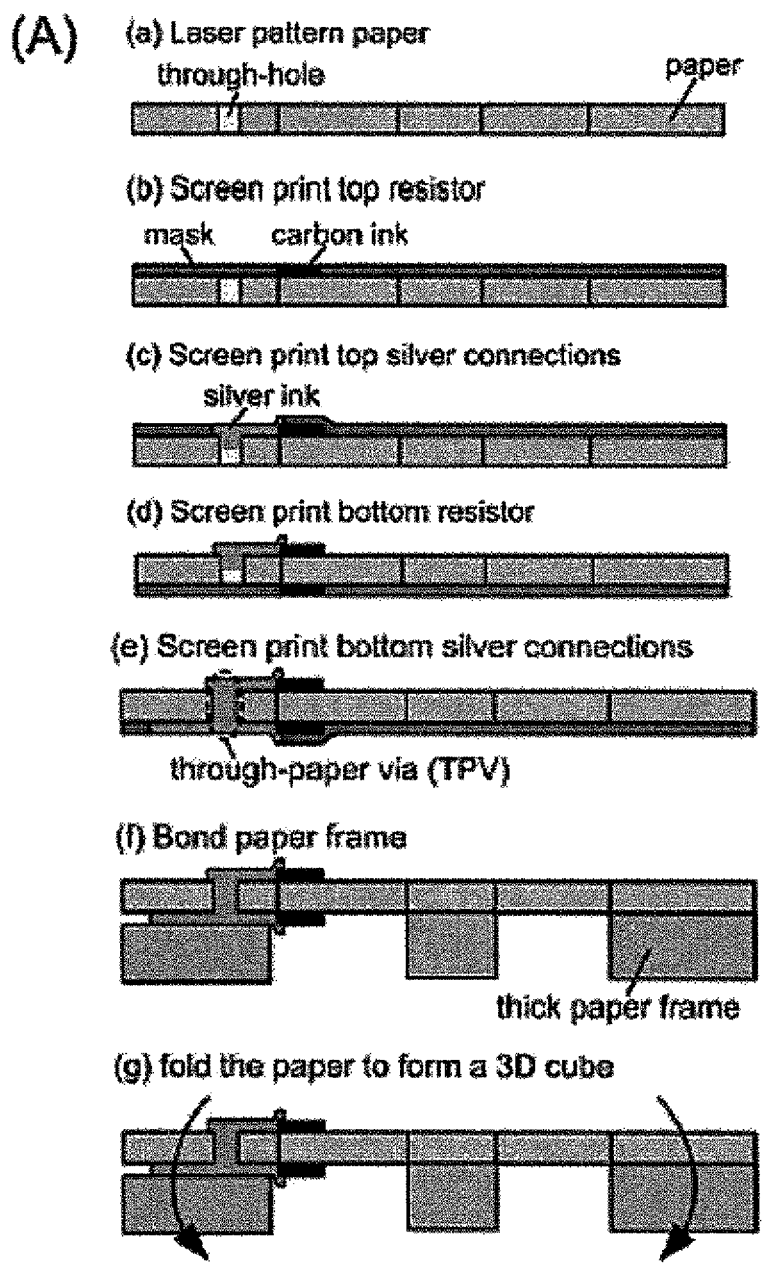
FIGS. 14A-B shows the fabrication process of the paper-based accelerometer.

The paper-based accelerometer was fabricated by cutting, screen-printing, and folding of paper. FIG. 14A shows the fabrication process. A piece of paper was cut into a pre-designed pattern (shown in left photo of FIG. 14B) using a laser cutter, during which the proof masses tethered by four

TABLE 2

Comparison of specifications of a commercial silicon-based MEMS sensor (AE-801, Kronex Technology) and our paper-based MEMS sensor

| Specifications | Commercial silicon MEMS sensor (AE-801, Kronex) | Paper-based MEMS sensor |
| --- | --- | --- |
| Sensing principle | Piezoresistive | Piezoresistive |
| Material | Silicon | Paper, carbon/silver inks |
| Beam size (L × W × H) | 5 mm × mm × 0.75 mm | 44.5 mm × 7.7 mm × 03.4 mm |
| Beam stiffness | 2000 mN mm$^{-1}$ | 2 mN mm$^{-1}$ |
| Natural frequency | ~12 kHz | ~25 Hz |
| Force range | 120 mN | 16 mN |
| Force resolution | 40 μN | 120 μN |
| Sensitivity | 2.5 mV mN$^{-1}$ | 0.84 mV mN$^{-1}$ |
| Fabrication process | >1 day in cleanroom | <1 hour in laboratory |
| Device cost | $168 per device (commercial price)[a] | $0.04 per device (cost of materials for a prototype) |

[a]This price consists of, in addition to profit margin, a wide variety of costs, including materials, amortization and operation of facilities, packaging, quality control, marketing and distribution, and so on.

beams are patterned in three regions that will form orthogonal surfaces after folding. Pairs of insets and slots were patterned to connect different surfaces together to form a mechanically stable paper cube. Graphite ink was screen-printed to form both the sensing piezoresistors ($R_1$ and $R_2$ in FIG. 13B) and the other resistors in the Wheatstone bridge circuit ($R_3$ and $R_4$ in FIG. 13B), and silver ink was screen-printed to pattern the electrical connections of the circuit. Since the Wheatstone bridge circuit is laid out on both sides of the patterned paper substrate, and a technology was developed to pattern vertical electrical connections through the paper substrate (called "through-paper via" or TPV, in contrast to the "through-silicon via" technology (M. Motoyoshi, *Proceedings of the IEEE*, 2009, 97, 43-48) in conventional MEMS fabrication). 0.2 mm through-holes was cut out while laser-patterning the paper substrate (FIG. 14A(a)), then the paper through-holes were filled half way through using silver during screen-printing of silver connections on one side of the substrate (FIG. 14A(c)), and finally the holes were completely filled from the other side with silver to form complete TPVs (FIG. 14A(e)).

Figure 14B:
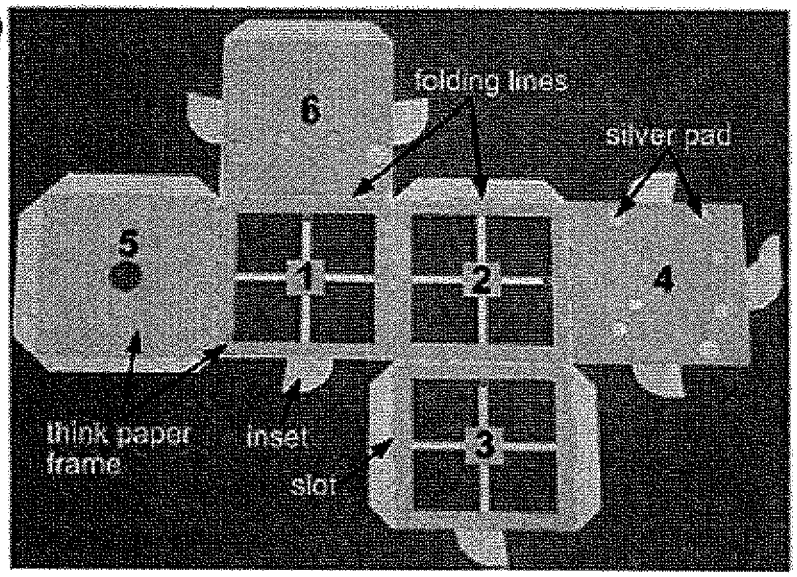
Figure 14B:
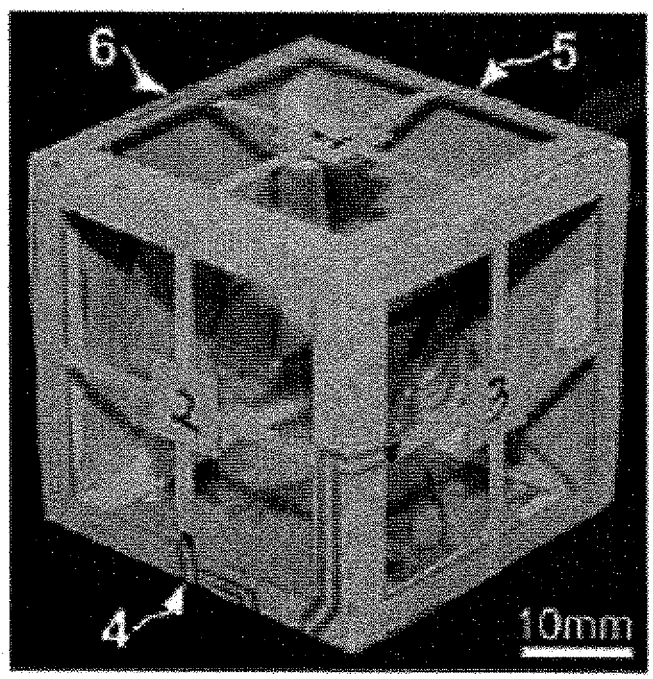

After laser-cutting and screen-printing of the paper substrate, another layer of thick paper was bonded with the substrate as mechanical frames; such frames provide stable mechanical support for the paper cube (which is especially useful when a thin-paper substrate is used to enhance the resolution of the sensor. The paper substrate is then folded into a cube, and the surfaces of the device silanized with (tridecafluoro-1,1,2,2-tetrahydrooctyl)trichlorosilane vapor to render the paper surfaces hydrophobic. FIG. 14B shows a complete paper-based accelerometer. The fabrication process can be completed in four hours.

Testing: Detection of Contact Force and Drop-Impact Acceleration

Figures 15A, 15B:
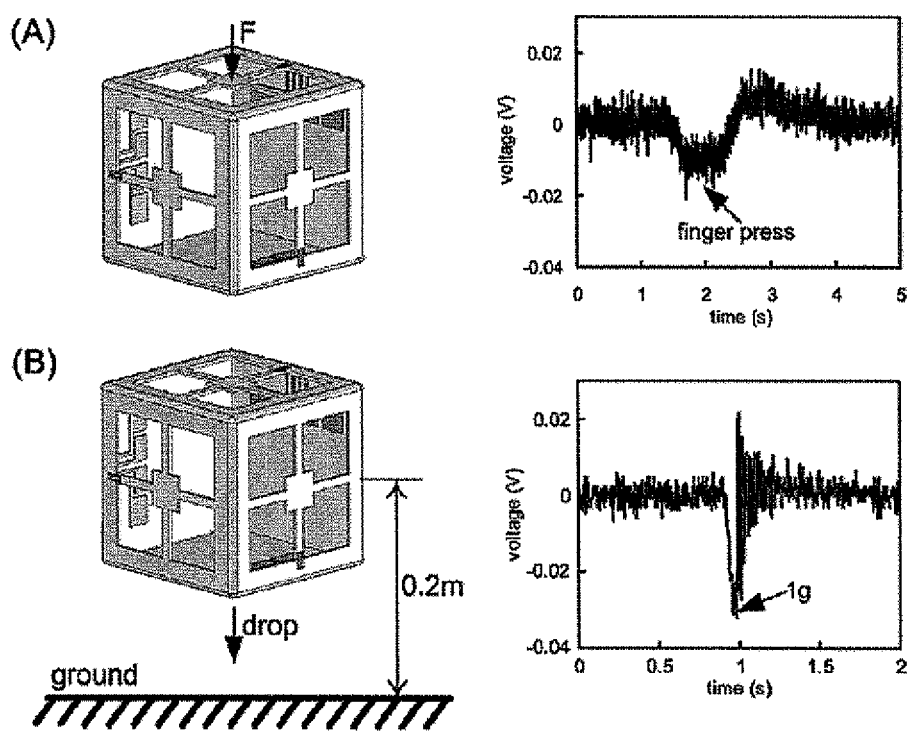
FIGS. 15A-B shows detection of contact force and drop-impact acceleration.

Static testing of the paper-based accelerometer was performed by using it as a tactile sensor. One of the proof masses was pressed with finger and measured the output voltage of the corresponding Wheatstone bridge circuit. As shown in FIG. 15A, a millivolt-level change in output voltage was observed.

Drop-impact testing was also performed of the paper-based accelerometer by dropping the sensor to the ground from 0.2 m above. Upon hitting the group, the sensor produced an attenuating wave of the output voltage with initial peak amplitude of 32 mV. As shown in FIG. 15B, the amplitude value of initial peak (32 mV) approximately corresponds to the gravitational acceleration (1 g).

Example 3

Paper as a Hydrophobic Surface

A hydrophobic surface on paper (i.e., cellulose) was created. A hydrophobic surface is formed on paper by silanizing the surface of paper (cellulose) fibers through chemical vapor deposition. By using different types of chemical reactions to introduce fluorinated and non-fluorinated groups, it was demonstrated that the observed hydrophobicity is due to the exposed surface groups and not the capping of hydroxyl groups on the surface. The linkage bonds were exploited to form pH-sensitive hydrophobic paper surfaces.

Procedure and Result

Hydrophobic Paper

Figures 16A, 16B:
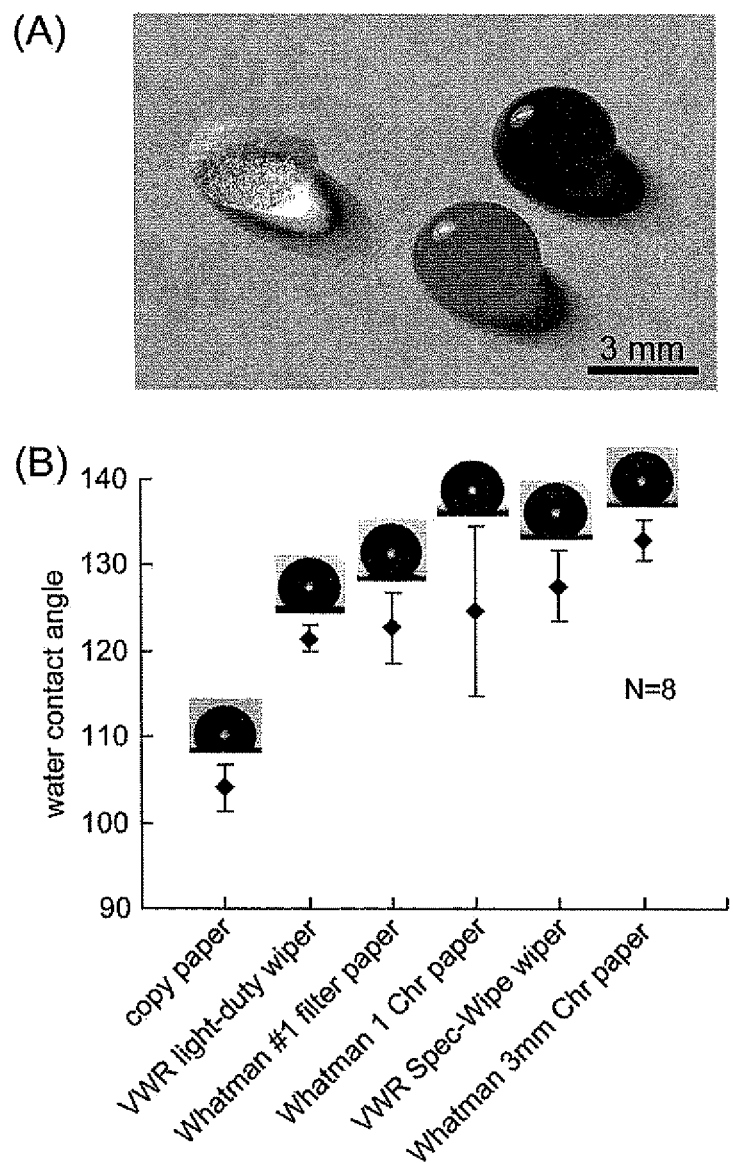
FIGS. 16A-B show silanization of paper produces a hydrophobic surface.

To render paper hydrophobic, the hydroxyl groups of the paper cellulose fibers were functionalized with (tridecafluoro-1,1,2,2-tetrahydrooctyl)trichlorosilane vapor to form surface silanol linkages, and thus generated a hydrophobic surface (FIG. 16A). Six types of paper were silanized and measured for their water contact angles (FIG. 16B) using a contact angle goniometer. Among these types of paper, Whatman 3 mm chromatography paper provides the highest contact angle (132.9°±2.3°) after silanization.

Figures 17A, 17B, 17C:
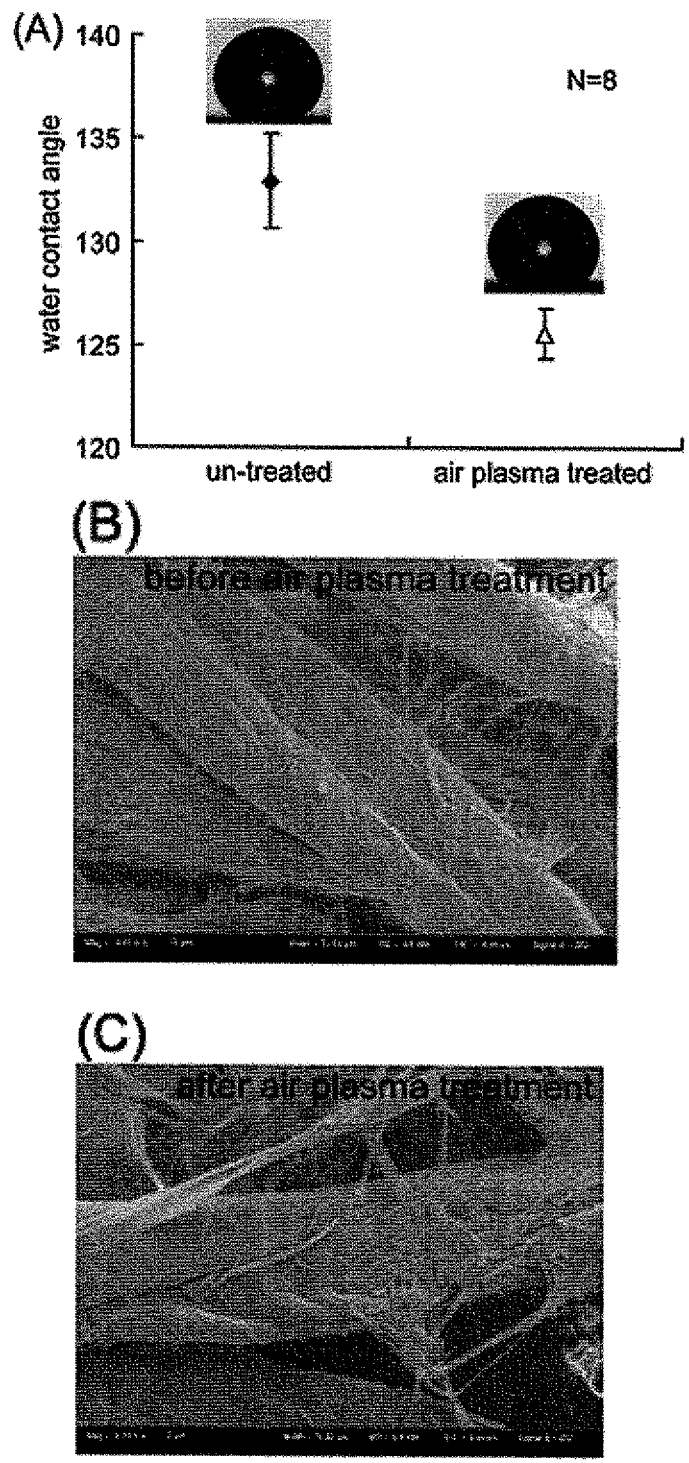
FIGS. 17A-C show that air plasma treatment decreases the contact angle of the paper substrate after silanization.

The paper substrate (Whatman 3 mm chromatograph y paper) (FIG. 17B) was treated by air plasma for two minutes (FIG. 17C), and then performed the silanization. As shown in FIG. 17A, the plasma-treated substrate had a lower water contact angle)(125.5°±1.2° than the un-treated substrate (132.9°±2.3°).

Fluorinated Aryl Ester Paper v. Silanized Paper

The surface hydroxyl groups were reacted with acyl chlorides—using 6-bromo hexanoyl chloride and 3,5-bis (trifluoromethyl)benzoyl chloride, leading to labile glycosidic ester bonds (Scheme 16B). The contact angles between water and the fluorinated aryl ester paper was 132° which is slightly lower than that obtained from the silanized paper (Table 3). When the paper is acylated with 6-bromo hexanoyl chloride it readily wicks water on contact.

TABLE 3

| | Contact Angle | |
|---|---|---|
| Liquid | Acylated | Silanized |
| DI Water | 132.1 | 141 |
| PBS 1X, pH7 | 132.6 | 140 |
| Phosphate buffer, pH7 | 129.3 | 140.2 |
| Tris, pH 8.3 | Wicks | 141.5 |

Chemistry

Scheme 1 shows the reaction of cellulose with a silanizing and acylating reagents as discussed above. In reaction A the silanization is achieved by reaction of the surface hydroxyls with a trichlorosilane, the highly fluorinated hydrocarbons leads to surface exposed fluorides which renders the pap er hydrophobic. In reaction B acylation with a fluoroaryl or a bromo alkyl leads to surface exposed halides via glycosidic esters linkages.

Scheme 1.

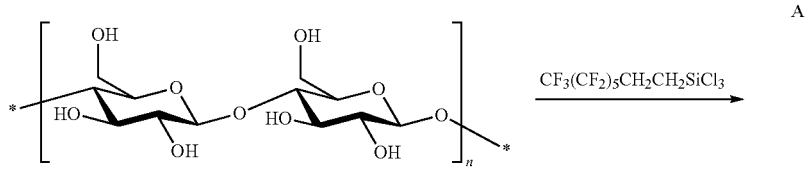

A

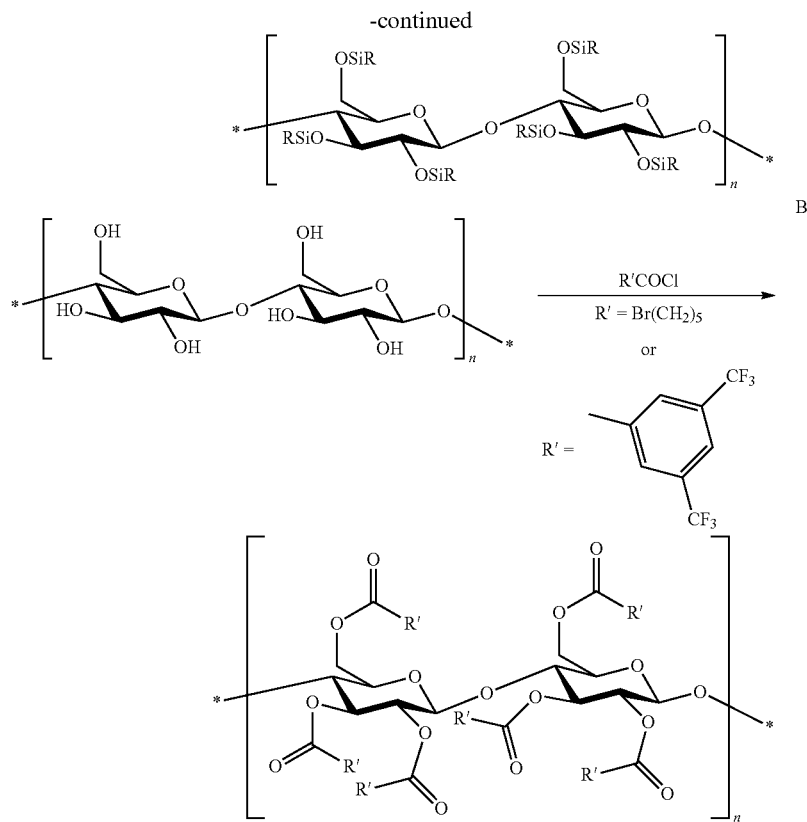

Water v. Buffer

The contact angles for PBS (phosphate buffered saline), Phosphate buffer, and Tris for the treated papers were measured. For the silanized hydrophobic paper, comparable contacts angles for any of the buffers compared to water were observed (~140°, Table 3). This type of paper did not show any appreciable changes in the contact angles even on leaving the paper in contact with the drops for hours. For the aryl fluoride treated paper, the contact angles were comparable to water, ~130° (Table 3), for the buffer solutions at pH 7 (PBS and phosphate buffer). As anticipated, our attempts to measure contact angles Tris buffer (pH 8.3), however, were unsuccessful as the paper rapidly lost hydrophobicity leading to wicking of the buffer1. Attempts to measure contact angles with organic solvents (toluene, hexadecane and perfluorodecalin) were unsuccessful as these solvents readily wet the paper.

Hydrophobicity after Passage of Water

A piece of the silanized paper was placed on a Hirsch funnel connected to a vacuum line via a side-stemmed Erlenmeyer flask and passed copious amounts of water through the paper by applying vacuum—similar to a filtration. Even on repeated passage of large volumes of water, the surface of the paper was still hydrophobic.

Water Vapor of Silanized Paper

Silanized paper was placed on a cold surface to allow water to condense on the surface. As anticipated, a large condensate was observed which upon warming to room-temperature formed droplets on the non-silanized surface and very tiny droplets on the silanized paper surface. A small amount of condensate was observed underneath the paper which could be due to trapped water vapor or from vapor that flux through the pores of the hydrophobic paper.

We claim:

1. A micro-electro-mechanical systems (MEMS) device comprising:
   a stationary platform;
   a deflectable element integral to the stationary platform, wherein the stationary platform and deflectable element are comprised of a flexible insulating paper or fabric; and
   a piezoresistive element disposed over at least a portion of the deflectable element.

2. The device of claim 1, wherein the device is a sensor.

3. The device of claim 2, further comprising a conductive inks.

4. The device of claim 3, further comprising an integrated signal processing circuit.

5. The device of claim 1 wherein the device is a three dimensional micro-electro-mechanical systems (MEMS) device comprising a flexible insulating paper or fabric substrate material.

6. The device of claim 5, wherein the device contains three sensors positioned orthogonally.

7. The device of claim 1 wherein the device is a two dimensional sensors.

8. The device of claim 7 wherein the paper or fabric is folded, creased, or pleated to increase rigidity.

9. The device of claim 1 further comprising a plastic film overlaid on the paper or fabric.

10. The device of claim 1 wherein the paper or fabric has been covalently or non-covalently modified to increase its hydrophobicity.

11. The device of claim 1 made by printing or screening of circuitry onto the paper or fabric using piezoresistive and/or conductive inks, which can then be attached to wires or other means of transmitting a signal.

12. The device of claim 1 wherein the device is a force sensor comprising an accelerometer which quantifies acceleration, wherein a proof mass is incorporated into the deflectable element, wherein a portion of the deflectable element functions as a proof mass, or wherein a proof mass is affixed to the deflectable element, wherein deformation of the proof mass, stresses the piezoresistive element, wherein the proof mass can be fabricated from the paper or fabric or another material.

13. The device of claim 10 wherein the force sensor is a force sensing cantilever beam device.

14. The device of claim 1 comprising multiple two-dimensional force-sensing devices arranged in a three-dimensional configuration.

15. The device of claim 14 comprising multiple two dimensional sensors arranged orthogonally to measure force along more than one axis simultaneously.

16. The device of claim 15 wherein a two-dimensional array of sensors is fabricated on a substrate, which is subsequently folded into a three dimensional structure to present three sensors orthogonally to simultaneously sense force along three orthogonal directions (x-y-z).

17. The device of claim 1 printed on a roll which is then applied in a manner similar to labels, with pre-applied or simultaneously applied adhesive.

18. The device of claim 1 in or on a toy.

19. The device of claim 1 applied to a shipping container.

20. A method of making the device of claim 1 comprising providing flexible insulating paper or fabric substrate material and depositing conductive material on or in a pattern thereon to create a sensor.

* * * * *